(12) United States Patent
Lee et al.

(10) Patent No.: US 11,942,434 B2
(45) Date of Patent: Mar. 26, 2024

(54) METHOD OF MANUFACTURING A SEMICONDUCTOR PACKAGE

(71) Applicant: SAMSUNG ELECTRONICS CO., LTD., Suwon-si (KR)

(72) Inventors: Sangkyu Lee, Suwon-si (KR); Jingu Kim, Suwon-si (KR); Kyungdon Mun, Hwaseong-si (KR); Shanghoon Seo, Anyang-si (KR); Jeongho Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/731,841

(22) Filed: Apr. 28, 2022

(65) Prior Publication Data

US 2022/0254725 A1 Aug. 11, 2022

Related U.S. Application Data

(63) Continuation of application No. 16/990,717, filed on Aug. 11, 2020, now Pat. No. 11,342,274.

(30) Foreign Application Priority Data

Jan. 23, 2020 (KR) .......................... 10-2020-0009340

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............... H01L 23/5389; H01L 23/562; H01L 23/3128; H01L 23/5383; H01L 23/5386; H01L 21/4853; H01L 21/565; H01L 21/6835; H01L 21/4857; H01L 21/568; H01L 25/105; H01L 25/50; H01L 24/20; H01L 24/19; H01L 2924/3511;
(Continued)

(56) References Cited

U.S. PATENT DOCUMENTS 5,972,734 A 10/1999 Carichner et al.
9,142,510 B2 9/2015 Lee et al.
(Continued)

FOREIGN PATENT DOCUMENTS

KR 20190100845 A 8/2019

*Primary Examiner* — Kyoung Lee
*Assistant Examiner* — Christina A Sylvia
(74) *Attorney, Agent, or Firm* — Myers Bigel, P.A.

(57) ABSTRACT

A semiconductor package is disclosed. The semiconductor package includes a back-side wiring substrate and a front-side redistribution layer which are in parallel, and a connector, a semiconductor chip and an encapsulator which are between the back-side wiring substrate and the front-side redistribution layer. The encapsulator surrounds surfaces of the connector and the semiconductor chip. The back-side wiring substrate includes a core layer, a back-side via plug extending through the core layer, and a back-side redistribution layer on the back-side via plug.

18 Claims, 28 Drawing Sheets

(51) Int. Cl.
  *H01L 21/56* (2006.01)
  *H01L 21/683* (2006.01)
  *H01L 23/00* (2006.01)
  *H01L 23/31* (2006.01)
  *H01L 25/00* (2006.01)
  *H01L 25/10* (2006.01)

(52) U.S. Cl.
  CPC .......... *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 23/562* (2013.01); *H01L 24/19* (2013.01); *H01L 24/20* (2013.01); *H01L 25/105* (2013.01); *H01L 25/50* (2013.01); *H01L 2221/68372* (2013.01); *H01L 2224/214* (2013.01); *H01L 2225/1035* (2013.01); *H01L 2225/1052* (2013.01); *H01L 2225/1058* (2013.01); *H01L 2924/3511* (2013.01)

(58) Field of Classification Search
  CPC ..... H01L 2225/1052; H01L 2225/1035; H01L 2225/1058; H01L 2224/214; H01L 2221/68372
  See application file for complete search history.

(56) References Cited

U.S. PATENT DOCUMENTS

| | | |
|---|---|---|
| 9,318,442 B1 | 4/2016 | Chen |
| 9,508,674 B2 | 11/2016 | Pan et al. |
| 9,659,805 B2 | 5/2017 | Hu et al. |
| 9,748,167 B1 | 8/2017 | Lin |
| 9,831,156 B2 | 11/2017 | Lin |
| 9,887,148 B1 | 2/2018 | Huang et al. |
| 9,941,318 B2 | 4/2018 | Hirano et al. |
| 9,966,325 B2 | 5/2018 | Beyne |
| 10,037,961 B2 | 7/2018 | Chiu et al. |
| 10,068,844 B2 | 9/2018 | Chiu et al. |
| 10,083,891 B1 | 9/2018 | Graf et al. |
| 10,157,835 B2 | 12/2018 | Yu et al. |
| 10,163,852 B2 | 12/2018 | Yu et al. |
| 10,170,341 B1* | 1/2019 | Lin .................... H01L 21/4853 |
| 10,269,587 B2 | 4/2019 | Lin et al. |
| 10,269,851 B2 | 4/2019 | Yee et al. |
| 10,332,924 B2 | 6/2019 | Hirano et al. |
| 10,950,586 B2 | 3/2021 | Cho |
| 2010/0246152 A1 | 9/2010 | Lin et al. |
| 2013/0241080 A1 | 9/2013 | Pagaila |
| 2013/0270682 A1 | 10/2013 | Hu et al. |
| 2015/0115467 A1 | 4/2015 | Park et al. |
| 2016/0056087 A1 | 2/2016 | Wu et al. |
| 2016/0093572 A1* | 3/2016 | Chen .................. H01L 23/5389 438/126 |
| 2016/0118333 A1 | 4/2016 | Lin |
| 2016/0336299 A1 | 11/2016 | Marimuthu et al. |
| 2017/0011934 A1 | 1/2017 | Hu |
| 2017/0213807 A1 | 7/2017 | Benaissa et al. |
| 2018/0316083 A1* | 11/2018 | Chen ................. H01L 23/49827 |
| 2018/0343751 A1* | 11/2018 | Tuominen ................. C09J 9/02 |
| 2019/0148262 A1 | 5/2019 | Pei et al. |
| 2020/0315009 A1* | 10/2020 | Nakamura ........... H05K 1/0271 |

\* cited by examiner

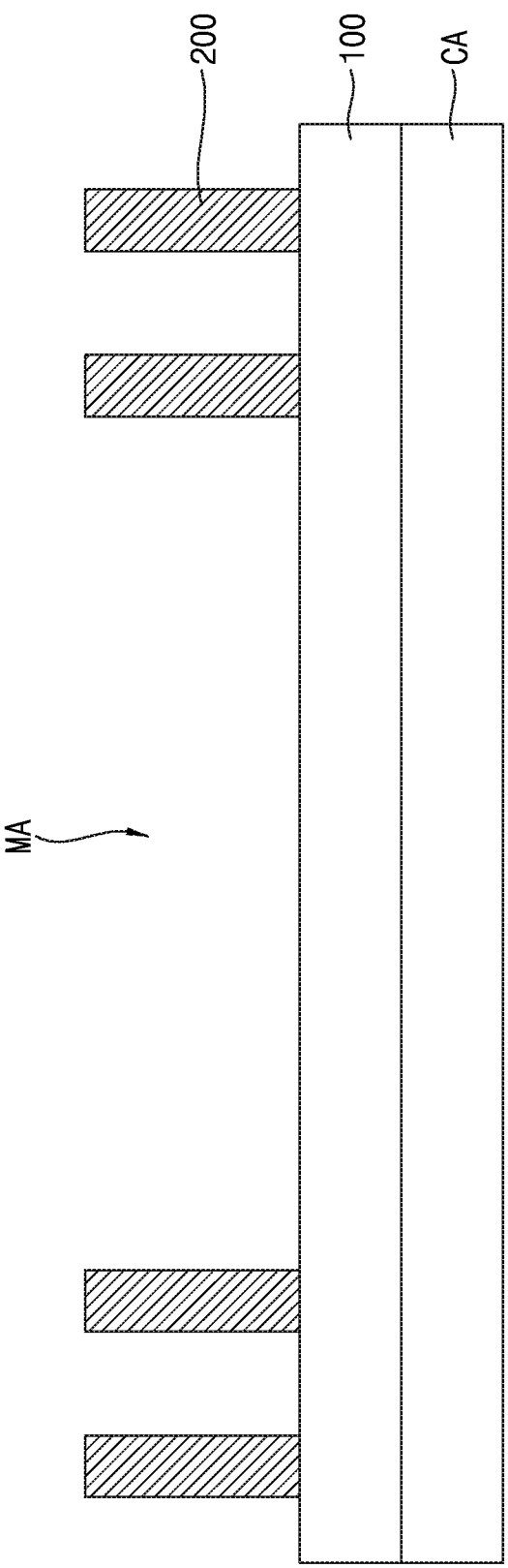

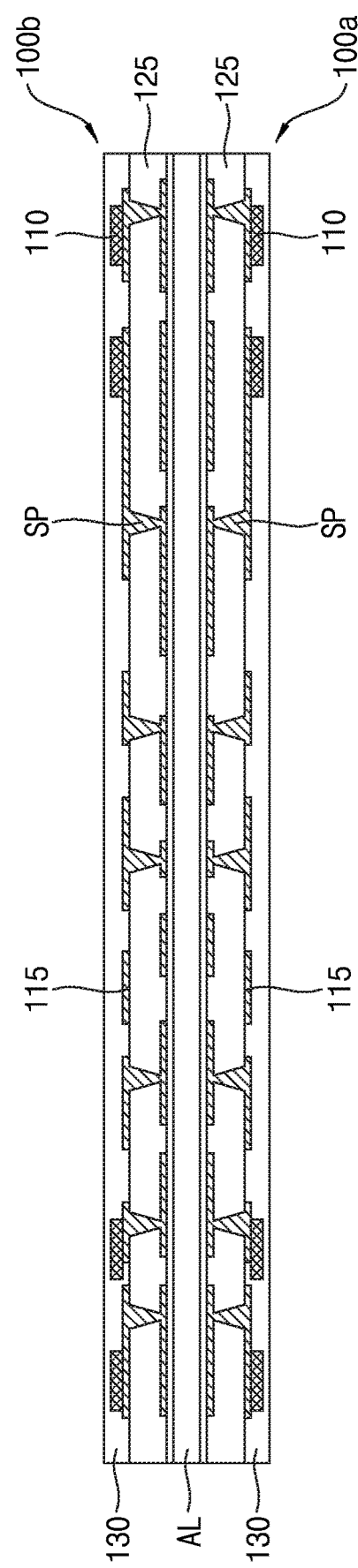

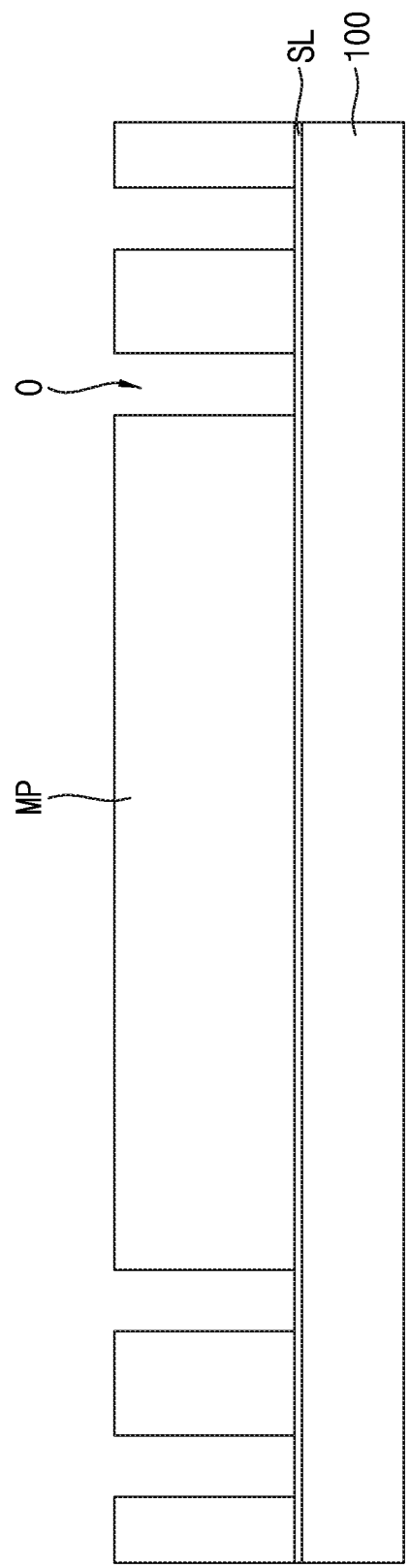

METHOD OF MANUFACTURING A SEMICONDUCTOR PACKAGE

CROSS-REFERENCE TO THE RELATED APPLICATIONS

This application is a continuation of U.S. patent application Ser. No. 16/990,717, filed Aug. 11, 2020, which itself claims priority from Korean Patent Application No. 10-2020-0009340, filed on Jan. 23, 2020, in the Korean Intellectual Property Office, the disclosures of both of which are incorporated herein by reference in their entireties.

FIELD

The embodiments of the disclosure relate to a semiconductor package and a method for manufacturing a semiconductor package, and in particular, to a semiconductor package for eliminating an interposer between an upper package and a lower package and increasing the number of layers of a back-side redistribution.

BACKGROUND

Recently, the market for mobile phones has rapidly transitioned to 5G beyond 4G. Furthermore, the amount of data used in mobile phones is increasing, and user convenience (user interface (UI)) is also being further strengthened. In addition, application processors (APs) used in mobile phones increasingly have higher specifications achieved through higher integration. Such higher specifications result in increases in signal density. Even in association with semiconductor package structures, a multilayer redistribution layer structure of two or more layers may be needed. Meanwhile, semiconductor packages have increasing become thinner. In particular, in the case of a package-on-package (PoP) type package used in mobile APs, in which a memory is stacked on a package, the total thickness thereof may be 1.0 mm or less.

In a semiconductor package having a PoP structure, a lower package has a back-side redistribution layer for connection to an upper package, and a front-side redistribution layer for connection to an external circuit. In a conventional fan-out panel-level package (FOPLP), a separate cavity for attachment of a semiconductor chip is formed in a PCB substrate. After the semiconductor chip is embedded in the cavity, fine patterning lithography for formation of a back-side redistribution layer (RDL) and another fine patterning lithography for formation of a front-side redistribution layer are carried out. In such a conventional technology, a process such as $CO_2$ laser machining may be used for formation of the cavity. Furthermore, double fine patterning lithography may be used for formation of redistribution layers at opposite sides. In particular, the front-side redistribution layer is formed under the condition that a carrier is attached to the back side, and the carrier attached to the back side is then removed. Subsequently, a process for forming the back-side redistribution layer is carried out under the condition that a secondary carrier is again attached to the front side. In this case, accordingly, there may be problems in that as the number of process steps increases, the manufacturing costs may increase. Furthermore, as the total number of layers in the front-side redistribution layer and the back-side redistribution layer increases, misalignment may be accumulated and, as such, an increase in failure rate may occur.

In another conventional technology in which a substrate is substituted for a back-side redistribution layer, a blind cavity for attachment of a semiconductor chip is formed in a substrate. In this case, although a back-side RDL formation process may not be needed, formation of the cavity in the substrate may still be needed. For this purpose, $CO_2$ laser machining or sandblasting may be used. Therefore, there may be a need to develop a semiconductor package structure capable of not only substituting a PCB substrate for the back-side redistribution layer, but also eliminating a process for forming a cavity at the PCB substrate, thereby achieving process simplification.

SUMMARY

The various embodiments of the disclosure provide a semiconductor package and a manufacturing method thereof which eliminate an interposer between an upper package and a lower package in a package-on-package (PoP) type package or eliminate a package substrate of the upper package through substitution of a printed circuit board (PCB) substrate for a back-side redistribution layer of the lower package.

In addition, the various embodiments of the disclosure provide a semiconductor package and a manufacturing method thereof for forming a back-side redistribution layer without execution of redistribution layer fine patterning lithography through use of a previously prepared substrate for the back-side redistribution layer, increasing the number of layers in the back-side redistribution layer, if necessary, without risk of decrease in yield caused by accumulation of misalignment caused by an increase in the number of layers in the redistribution layer, and attaching a known good die (KGD) to a known good unit (KGU), thereby further reducing risk of a decrease in yield.

Furthermore, the embodiments of the disclosure provide a semiconductor package and a manufacturing method thereof which eliminate a process for forming a cavity at a PCB substrate through electrical connection of a back-side redistribution layer and a front-side redistribution layer according to formation of a connector on the back-side redistribution layer and direct attachment of a semiconductor die to a substrate, thereby not only achieving process simplification, but also eliminating a post chemical treatment process for polishing an inner wall surface, such as de-burring or desmear, in the case in which the cavity is formed, preventing a decrease in yield or an increase in failure such as delamination caused by breakage of voids formed during encapsulation occurring in a subsequent back-side redistribution layer (RDL) formation process due to a rough inner wall surface, and/or reducing the total number of process steps due to a lack of a need for double attachment of a carrier.

A semiconductor package according to some embodiments of the disclosure may include a back-side wiring substrate and a front-side redistribution layer which are in parallel, and a connector, a semiconductor chip and an encapsulator which are between the back-side wiring substrate and the front-side redistribution layer. The encapsulator may be surrounding side surfaces of the connector and the semiconductor chip. The back-side wiring substrate may include a core layer, a back-side via plug extending through the core layer, and a back-side redistribution layer on the back-side via plug.

A package-on-package (PoP) type semiconductor package according to some embodiments of the disclosure may include a lower package and an upper package stacked on the lower package. The lower package may include a back-side wiring substrate and a front-side redistribution layer which are in parallel, and a connector, a lower semiconductor chip and an encapsulator which are disposed between the back-side wiring substrate and the front-side redistribution layer. The encapsulator may surround side surfaces of the connector and the lower semiconductor chip. The back-side wiring substrate may include a core layer, a back-side via plug extending through the core layer, and a back-side redistribution layer on the back-side via plug.

A semiconductor package according to some embodiments of the disclosure may include a front-side redistribution layer, a connector, a semiconductor chip and an encapsulator on an upper surface of the front-side redistribution layer, a back-side wiring substrate on the connector, the semiconductor chip and the encapsulator, and a package bump on a lower surface of the front-side redistribution layer. The encapsulator may surround side surfaces of the connector and the semiconductor chip. The front-side redistribution layer may include an insulating layer, a front-side redistribution layer and a front-side via plug. The back-side wiring substrate may include a printed circuit board (PCB) comprising a back-side wiring layer and a back-side via plug.

A semiconductor package according to another embodiment of the disclosure may include a back-side wiring substrate and a front-side redistribution layer which are in parallel, a semiconductor chip between the back-side wiring substrate and the front-side redistribution layer, an adhesive film between the semiconductor chip and the back-side wiring substrate, and an encapsulator on a side surface of the semiconductor chip. A coefficient of thermal expansion of the front-side redistribution layer may be higher than a coefficient of thermal expansion of the back-side wiring substrate. A modulus of elasticity of the back-side wiring substrate may be higher than a modulus of elasticity of the front-side redistribution layer.

A method for manufacturing a semiconductor package in accordance with another embodiment of the disclosure may include preparing a back-side wiring substrate, disposing connectors on a first surface of the back-side wiring substrate, disposing a lower semiconductor chip between the connectors on the first surface of the back-side wiring substrate, the lower semiconductor chip has a chip bump at an upper surface thereof, and providing an encapsulator on the first surface of the back-side wiring substrate. The encapsulator is on side surfaces of the connectors and the lower semiconductor chip. The method includes forming a front-side redistribution layer on the encapsulator, the connectors that are exposed and the chip bump, and disposing an upper package on a second surface of the back-side wiring substrate.

A method for manufacturing a semiconductor package in accordance with another embodiment of the disclosure may include preparing a printed circuit board (PCB) having flat first and second surfaces, disposing connectors on the first surface of the PCB, bonding a lower semiconductor chip having a chip bump between the connectors on the first surface of the PCB using an adhesive film, providing an encapsulator on the first surface of the PCB, such that the encapsulator covers side and upper surfaces of the connectors and the lower semiconductor chip, grinding an upper portion of the encapsulator to expose the connectors and the chip bump of the lower semiconductor chip, forming a front-side redistribution layer on the encapsulator, the connectors that are exposed, and the chip bump, and disposing an upper package on the second surface of the PCB.

A method for manufacturing a semiconductor package in accordance with still another embodiment of the disclosure may include preparing a back-side wiring substrate having a core layer, a back-side via plug, a back-side wiring layer, and a back-side pad, disposing connectors on the back-side pad on a first surface of the back-side wiring substrate, disposing a lower semiconductor chip between the connectors on the first surface of the back-side wiring substrate. The lower semiconductor chip has a chip bump at an upper surface thereof. The method includes providing an encapsulator on the first surface of the back-side wiring substrate. The encapsulator is on side and upper surfaces of the connectors and the lower semiconductor chip. The method includes grinding an upper portion of the encapsulator to expose the connectors and the chip bump of the lower semiconductor chip, forming a front-side redistribution layer on the encapsulator, the connectors that are exposed, and the chip bump, and disposing an upper package on a second surface of the back-side wiring substrate that is opposite the first surface of the back-side wiring substrate.

BRIEF DESCRIPTION OF THE DRAWINGS

FIGS. 4A to 4H are views explaining a method for manufacturing the semiconductor package or the PoP semiconductor package according to various embodiments of the disclosure.

FIGS. 5A and 5B are views showing cross-sections of back-side wiring substrates according to various embodiments of the disclosure manufactured through a detached copper foil (DCF) process.

FIGS. 6A to 6C are views explaining a method for forming a bump type connector according to various embodiments of the disclosure.

DETAILED DESCRIPTION

The embodiments of the disclosure relate to a semiconductor package capable of eliminating an interposer between an upper package and a lower package, eliminating a package substrate of the upper package, and increasing the number of layers of a back-side redistribution layer through substitution of a printed circuit board (PCB) substrate for a back-side redistribution layer of the lower package and a method for manufacturing the semiconductor package.

Figure 1A:
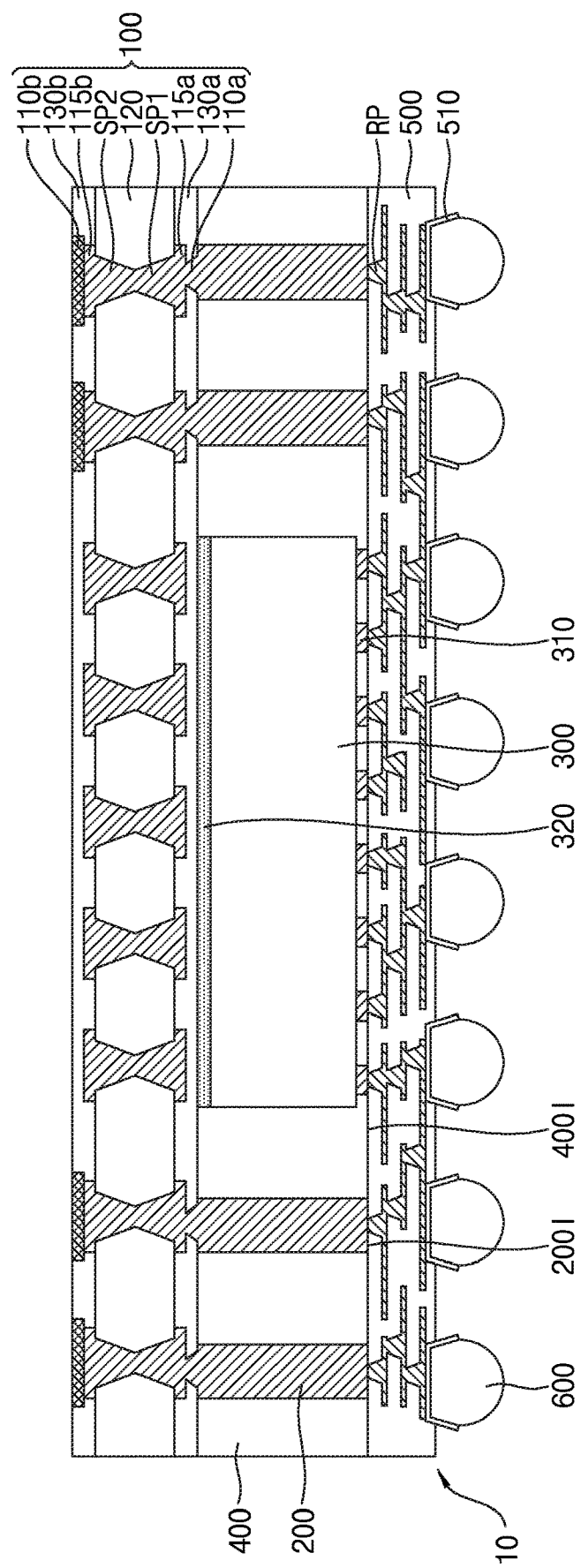
FIG. 1A is a view showing a cross-section of a semiconductor package according to various embodiments of the disclosure.

FIG. 1A is a view showing a cross-section of a semiconductor package 10 according to various embodiments of the disclosure. Referring to FIG. 1A, the semiconductor package 10 according to various embodiments of the disclosure may include a back-side wiring substrate 100, connectors 200, a semiconductor chip 300, an encapsulator 400, a front-side redistribution layer 500, and package bumps 600. For example, the semiconductor package 10 may include the front-side redistribution layer 500 and the back-side wiring substrate 100 which are disposed in parallel, and the connectors 200, the semiconductor chip 300 and the encapsulator 400 which are disposed between the front-side redistribution layer and the back-side wiring substrate 100.

The back-side wiring substrate 100 may include a printed circuit board (PCB). The back-side wiring substrate 100 may include a core layer 120, back-side via plugs SP1 and SP2, back-side wiring layers 115a and 115b, solder resist layers 130a and 130b, and back-side pads 110a and 110b.

The core layer 120 may be disposed at a central portion of the back-side wiring substrate 100. The core layer 120 may include paper, glass, epoxy (FR-4), etc. The core layer 120 may have high mechanical strength in order to prevent deformation of the substrate 100 against warpage, physical impact or the like. The back-side wiring substrate 100 may be disposed at a top of the semiconductor chip 300.

The back-side via plugs SP1 and SP2 may include lower back-side via plugs SP1 extending through a lower half portion of the core layer 120, and upper back-side via plugs SP2 extending through an upper half portion of the core layer 120. The back-side via plugs SP1 and SP2 may have an hourglass shape extending through the core layer 120. For example, the lower back-side via plugs SP1 may have a reversed cone shape or a reversed truncated cone shape having a relatively wide lower surface and a relatively narrow upper surface. That is, side surfaces of each lower back-side via plug SP1 may have a positive (+) inclination. In some embodiments, each lower back-side via plug SP1 may have a reversed quadrangular frusto-pyramid shape or a reversed polygonal frusto-pyramid shape. The upper back-side via plugs SP2 may have a reversed cone shape or a reversed truncated cone shape having a relatively narrow lower surface and a relatively wide upper surface. That is, side surfaces of each upper back-side via plug SP2 may have a negative (−) inclination. Here, positive inclination may mean a forward-uphill inclination, whereas negative inclination may mean a backward-uphill inclination. In some embodiments, each upper back-side via plug SP2 may have a quadrangular frusto-pyramid shape or a polygonal frusto-pyramid shape. The lower back-side via plugs SP1 and the upper back-side via plugs SP2 may have vertically symmetrical shapes (i.e., shapes that are similar in a vertical direction perpendicular to the substrate). The back-side via plugs SP1 and SP2 may include metal such as copper (Cu). In some embodiments where the back-side wiring substrate 100 includes a PCB substrate, the back-side via plugs SP1 and SP2 may have a taper shape having a cross-section reduced while extending toward the core layer 120. The back-side via plugs SP1 and SP2, which have such a taper shape, may be formed upon manufacturing the back-side wiring substrate 100 by performing, for the core layer 120, various processes such as drilling, plating, dry film resist (DFR) deposition, light exposure, development, etching, DFR delamination, solder resist (SR) deposition, light exposure, development, surface treatment, etc. in such a manner that each process proceeds from opposite sides of the core layer 120 toward a center of the core layer 120.

In some embodiments, when the back-side wiring substrate 100 has a small thickness, the back-side via plugs SP1 and SP2 may have a cylindrical shape or a through-hole shape.

The back-side wiring layers 115a and 115b may be formed on opposite surfaces of the core layer 120, respectively. The back-side wiring layers 115a and 115b may be connected to the back-side via plugs SP1 and SP2, respectively. The back-side wiring layers 115a and 115b may include metal such as copper (Cu).

The solder resist layers 130a and 130b may cover the back-side wiring layers 115a and 115b, respectively. The solder resist layers 130a and 130b may expose portions of the back-side wiring layers 115a and 115b, respectively. In some embodiments, each of the solder resist layers 130a and 130b may include a prepreg layer.

The back-side pads 110a and 110b may be formed at exposed portions of the back-side wiring layers 115a and 115b, respectively. Each of the back-side pads 110a and 110b may include under-bump metal disposed on a corresponding one of the back-side wiring layers 115a and 115b. For example, the back-side pads 110a and 110b may include a nickel (Ni) layer, a gold (Au) layer, and/or a silver (Ag) layer. In some embodiments, the back-side pads 110a and 110b may be portions of the back-side wiring layers 115a and 115b, respectively. In some embodiments, the solder resist layers 130a and 130b may be partially covered or partially overlapped by the back-side pads 110a and 110b, respectively, such that portions thereof may be exposed.

The front-side redistribution layer 500 may be formed through a redistribution layer (RDL) formation process. For example, the RDL formation process may include a wafer-level process. The front-side redistribution layer 500 may include a plurality of insulating layers and a plurality of redistribution patterns RP. The plurality of insulating layers may include at least one of a silicon-based insulating material such as silicon oxide or silicon nitride, a polymer such as polybenzoxazole (PBO), benzocyclobutene (BCB) or polyimide, or a nitride such as phosphosilicate (PSG) or borophosphosilicate (BPSG). The plurality of redistribution patterns RP may include a plurality of front-side redistribution layers and a plurality of front-side via plugs. A front-side redistribution layer may include an insulating layer, a front-side wiring layer and a front-side via plug. The plurality of front-side redistribution layers and the plurality of front-side via plugs may include metal such as tungsten (W), titanium (Ti), or copper (Cu). Each of the front-side via plugs may have a relatively narrow upper surface and a relatively wide lower surface. All of the front-side via plugs may have a truncated cone shape or a frusto-pyramid shape. For example, the plurality of front-side via plugs may have the same shape or a similar shape.

When both the back-side redistribution layer and the front-side redistribution layer are formed through an RDL formation process, misalignment error increases as the number of redistribution layers increases. For example, when the front-side redistribution layer is first formed using the RDL formation process, and the back-side redistribution layer is subsequently formed using the RDL formation process, it is necessary to form the front-side redistribution layer under the condition that a primary carrier is attached to the back side, and then to form the back-side redistribution layer under the condition that the primary carrier is removed, and a secondary carrier is then attached to a solder resist layer of the front-side redistribution layer. In this case, failure may occur due to misalignment between the front side and the back side. For this reason, the number of layers in the front-side redistribution layer may be limited. In the semiconductor package 10 according to some embodiments of the disclosure, a PCB substrate is substituted for the back-side redistribution layer and, as such, it may be possible to easily increase the number of layers in the back-side wiring substrate 100 and the front-side redistribution layer 500 in accordance with the number of layers in a substrate used in the semiconductor package 10.

The semiconductor chip 300 may be mounted between the back-side wiring substrate 100 and the front-side redistribution layer 500. The semiconductor chip 300 may be physically bonded to the solder resist layer 130 of the back-side wiring substrate 100 by a chip adhesive film 320. The semiconductor chip 300 may include chip bumps 310. The chip bumps 310 may be connected to the redistribution patterns RP of the front-side redistribution layers 500. Accordingly, the semiconductor chip 300 may be electrically connected to the selected redistribution patterns RP via the chip bumps 310. The chip bumps 310 may include metal or solder. The diameter or width of the horizontal cross-section of each chip bump 310 may be 10 μm to 300 μm, taking into consideration alignment allowed in light exposure.

Each connector 200 may be disposed to be spaced apart from a side surface of the semiconductor chip 300. Each connector 200 may have an upper end, which may contact a corresponding one of the lower back-side pads 110a, and a lower end, which may contact a corresponding one of the redistribution patterns RP of the front-side redistribution layer 500. Accordingly, the connectors 200 may electrically connect the back-side wiring substrate 100 and the front-side redistribution layer 500. The semiconductor chip 300 may be provided in plural. When the semiconductor chip 300 is provided in plural, another connector 200 may be disposed between adjacent semiconductor chips 300. The vertical height of each connector 200 may be determined taking into consideration flatness of the back-side wiring substrate 100 and surface flatness in a grinding process to be described later. The diameter or width of the horizontal cross-section of each connector 200 may be 10 μm to 300 μm. The diameter or width of each connector 200 may be determined taking into consideration alignment in light exposure, allowable current required in the chip, and the size of a via plug RP formed on each chip bump 310.

The encapsulator 400 may be disposed between the back-side wiring substrate 100 and the front-side redistribution layer 500. The encapsulator 400 may surround side surfaces of the connectors 200 and the semiconductor chip 300. The encapsulator 400 may include an epoxy molding compound (EMC).

The package bumps 600 may be disposed at a lower surface of the front-side redistribution layer 500. The package bumps 600 may connect the semiconductor package 10 to an external circuit (not shown). The package bumps 600 may include solder. The front-side redistribution layer 500 may further include under-bump metal (UBM) disposed between the redistribution patterns RP and the package bumps 600.

Figure 1B:
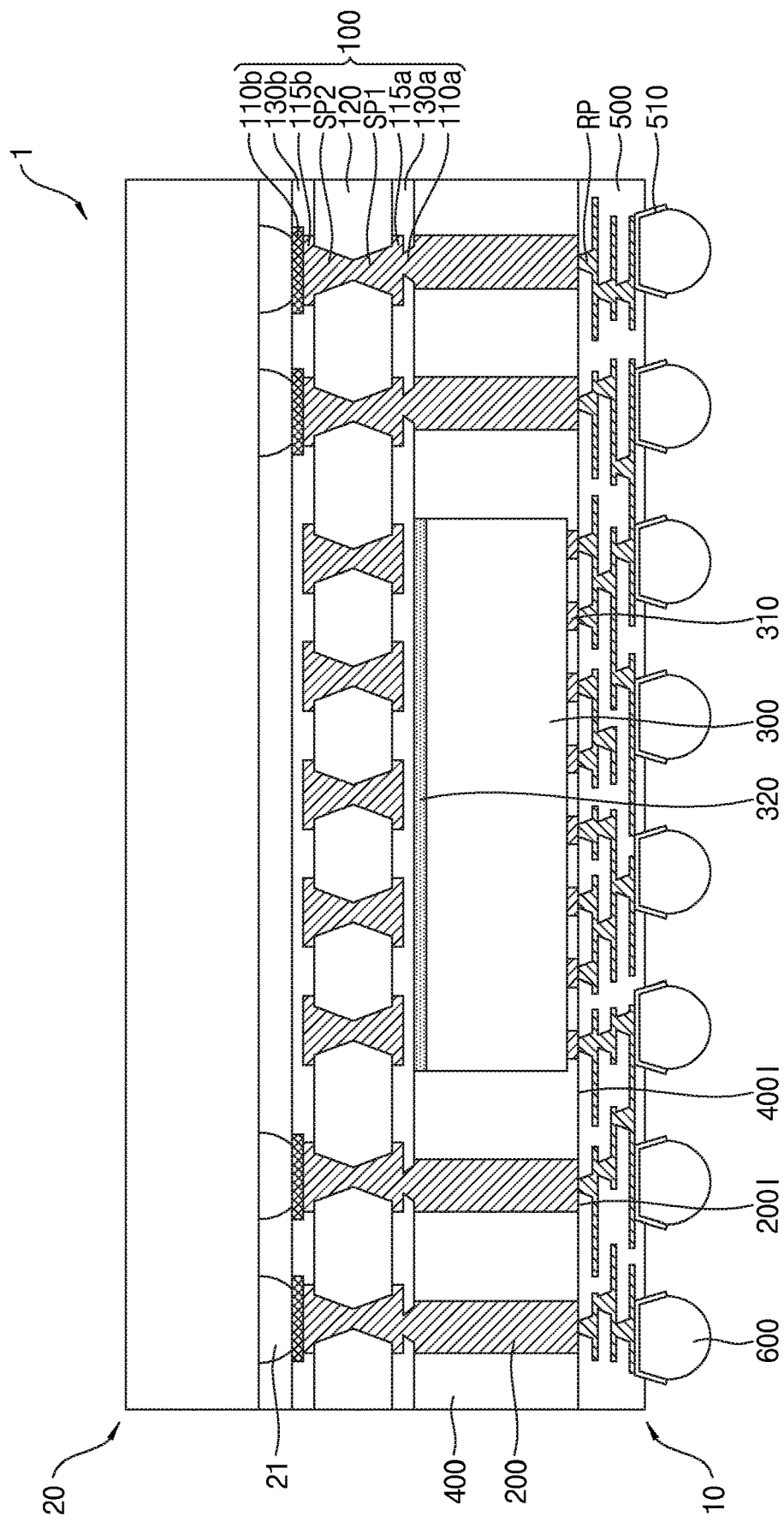
FIG. 1B is a view showing a cross-section of a package-on-package (PoP) type semiconductor package according to various embodiments of the disclosure.

FIG. 1B is a view showing a cross-section of a package-on-package (PoP) type semiconductor package 1 according to some embodiments of the disclosure. Referring to FIG. 1B, the semiconductor package 1 according to some embodiments of the disclosure may include a lower package 10, and an upper package 20 stacked on the lower package 10. The semiconductor package 10 according to the example embodiments of the disclosure discussed with respect to FIG. 1A may be applied to the lower package 10.

The upper package 20 may include upper package bumps 21 contacting respective upper back-side pads 110b of a back-side wiring substrate 100. The upper package bumps 21 may include solder.

Figure 1C:
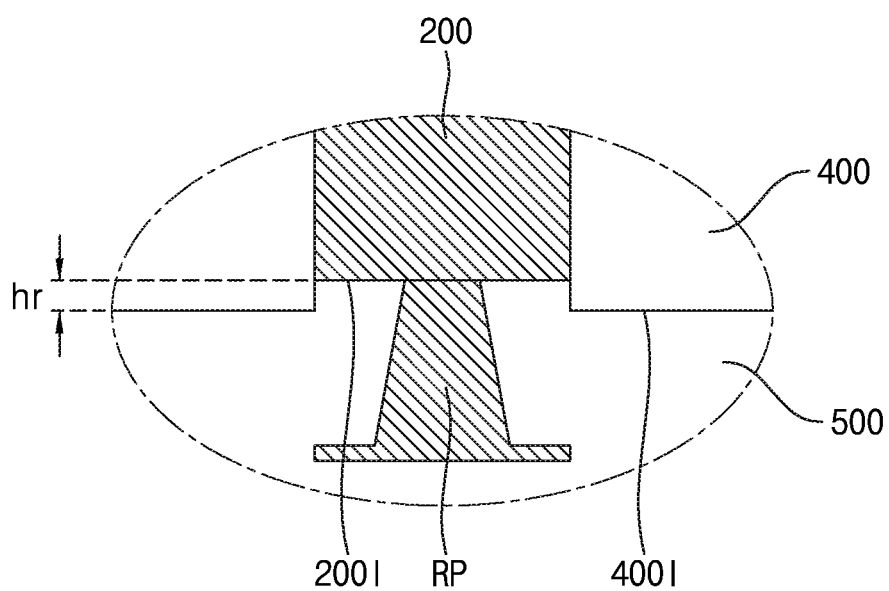
FIG. 1C is a view explaining the connectors according to various embodiments of the disclosure.

FIG. 1C is a view explaining the connectors 200 according to some embodiments of the disclosure. Referring to FIG. 1C, a lower surface 2001 of each connector 200 may be disposed at a higher level than a lower surface 4001 of the encapsulator 400. When a residue, such as foreign matter, is left on the lower surface 2001 of the connector 200, the lower surface 2001 of the connector 200 may be recessed upwards through an etching process or the like and, as such, foreign matter on the lower surface 2001 may be removed. The upward recess height hr of the lower surface 1001 of the connector 200 may be 0.05 μm to 5.00 μm. The upward recess height hr of the lower surface 2001 of the connector 200 for removal of foreign matter may be determined taking into consideration equipment used in a process for the front-side redistribution layer 500 to be formed at the back side.

Figure 1D:
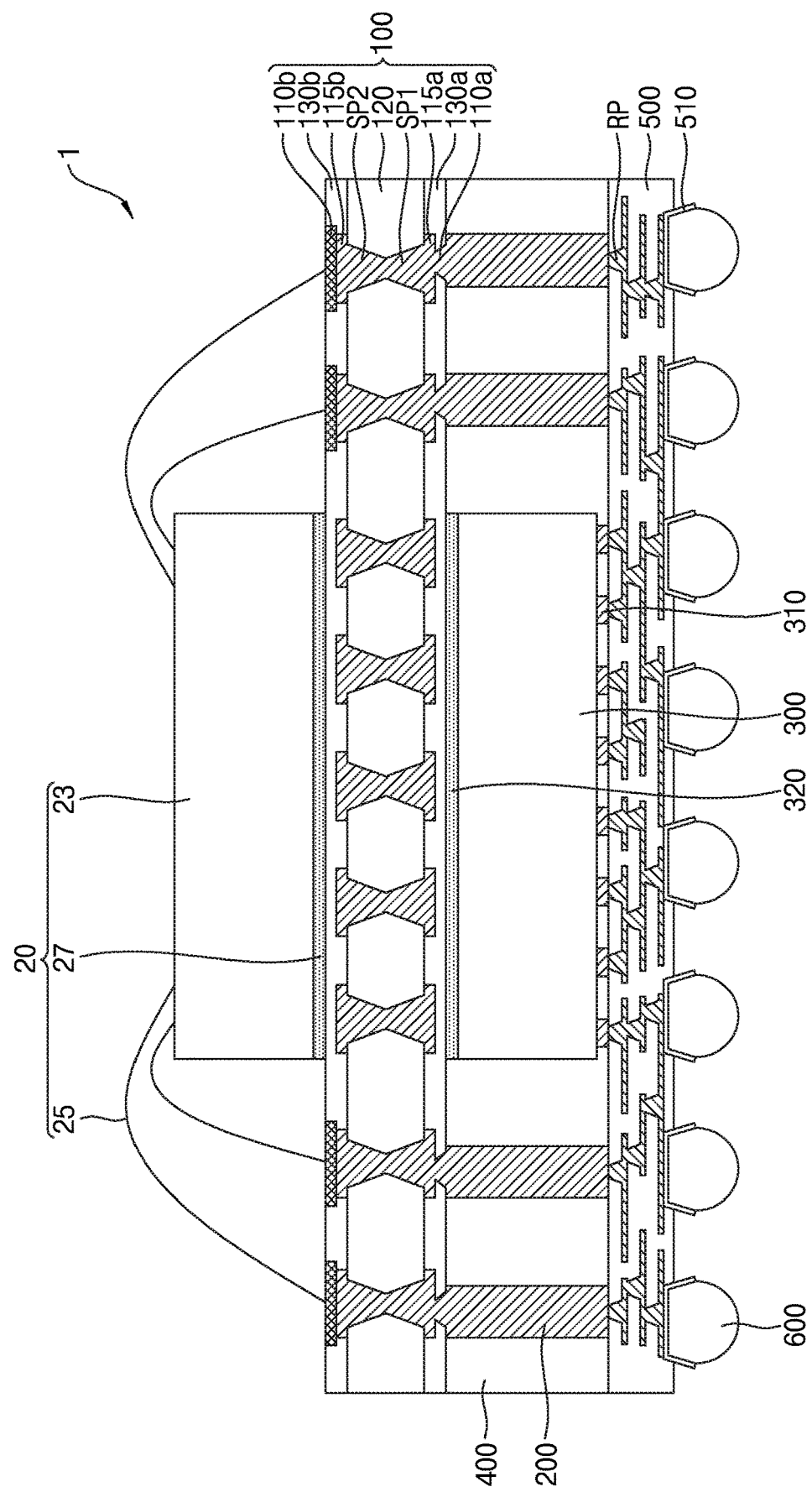
FIGS. 1D and 1E are views showing cross-sections of package-on-package (PoP) type semiconductor packages according to various embodiments of the disclosure.
Figure 1E:
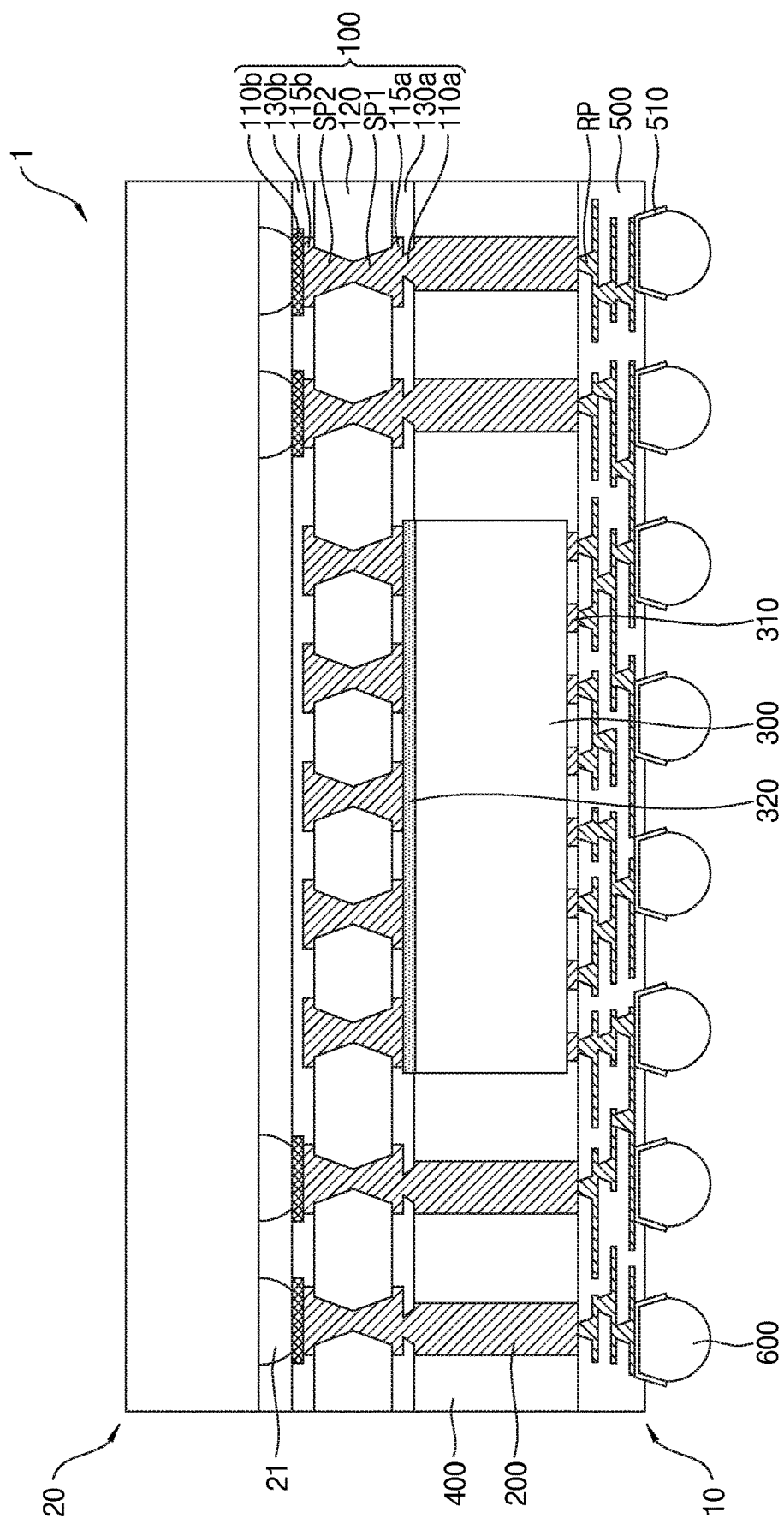

FIGS. 1D and 1E are views showing cross-sections of package-on-package (PoP) type semiconductor packages 1 according to various embodiments of the disclosure, respectively.

Referring to FIG. 1D, the PoP type semiconductor package 1 according to some embodiments of the disclosure may include a lower package 10, and an upper package 20 stacked on the lower package 10. The upper package 20 may include an upper semiconductor chip 23, upper bonding wires 25, and an upper chip adhesive film 27. The upper semiconductor chip 23 may be bonded to an upper surface of a back-side wiring substrate 100 by the upper chip adhesive film 27. For example, the upper chip adhesive film 27 may contact a solder resist layer 130b of the back-side wiring substrate 100. In some embodiments, the upper semiconductor chip 23 may be bonded to an upper surface of an upper back-side wiring layer 115b of a back-side wiring substrate 130b. For example, the upper chip adhesive film 27 may contact the upper back-side wiring layer 115b of the back-side wiring substrate 130b. The upper chip adhesive film 27 may include a die attach film (DAF).

Each upper bonding wire 25 is connected, at one end thereof, to the upper semiconductor chip 23 while being connected, at the other end thereof, to a corresponding one of the upper back-side pads 110b. In some embodiments, the upper package 20 may further include an upper package encapsulator covering or overlapping on the upper semiconductor chip 23, the upper bonding wires 25, and the upper chip adhesive film 27.

Referring to FIG. 1E, the PoP type semiconductor package 1 according to some embodiments of the disclosure may include a lower package 10 and an upper package 20 stacked on the lower package 10. A lower semiconductor chip 300 of the lower package 10 may be bonded to an upper surface of a lower back-side wiring layer 115a of a back-side wiring substrate 100. For example, a lower chip adhesive film 320 may contact the lower back-side wiring layer 115a of the back-side wiring substrate 100.

Figure 2A:
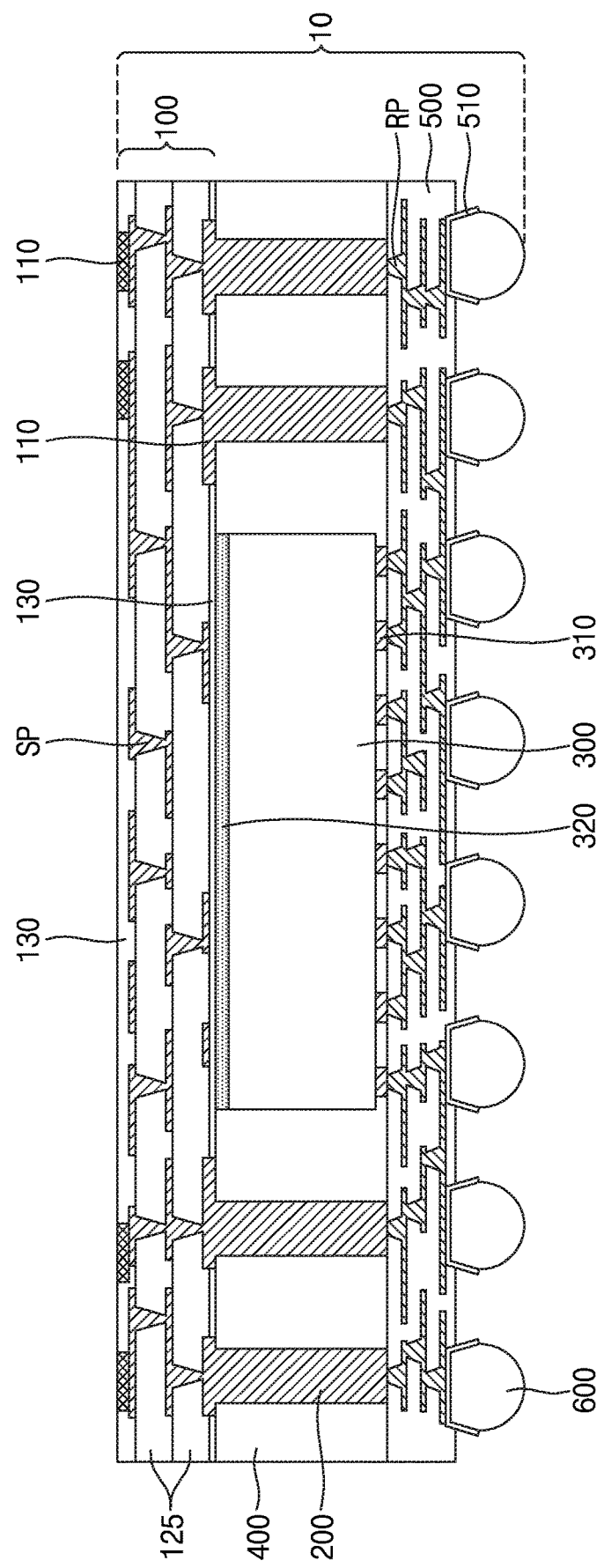
FIG. 2A is a view showing a cross-section of a semiconductor package according to various embodiments of the disclosure.

FIG. 2A is a view showing a cross-section of a semiconductor package 10 according to some embodiments of the disclosure. FIGS. 2B to 2E are views showing cross-sections of PoP type semiconductor packages 1 according to various embodiments of the disclosure, respectively.

Figure 2B:
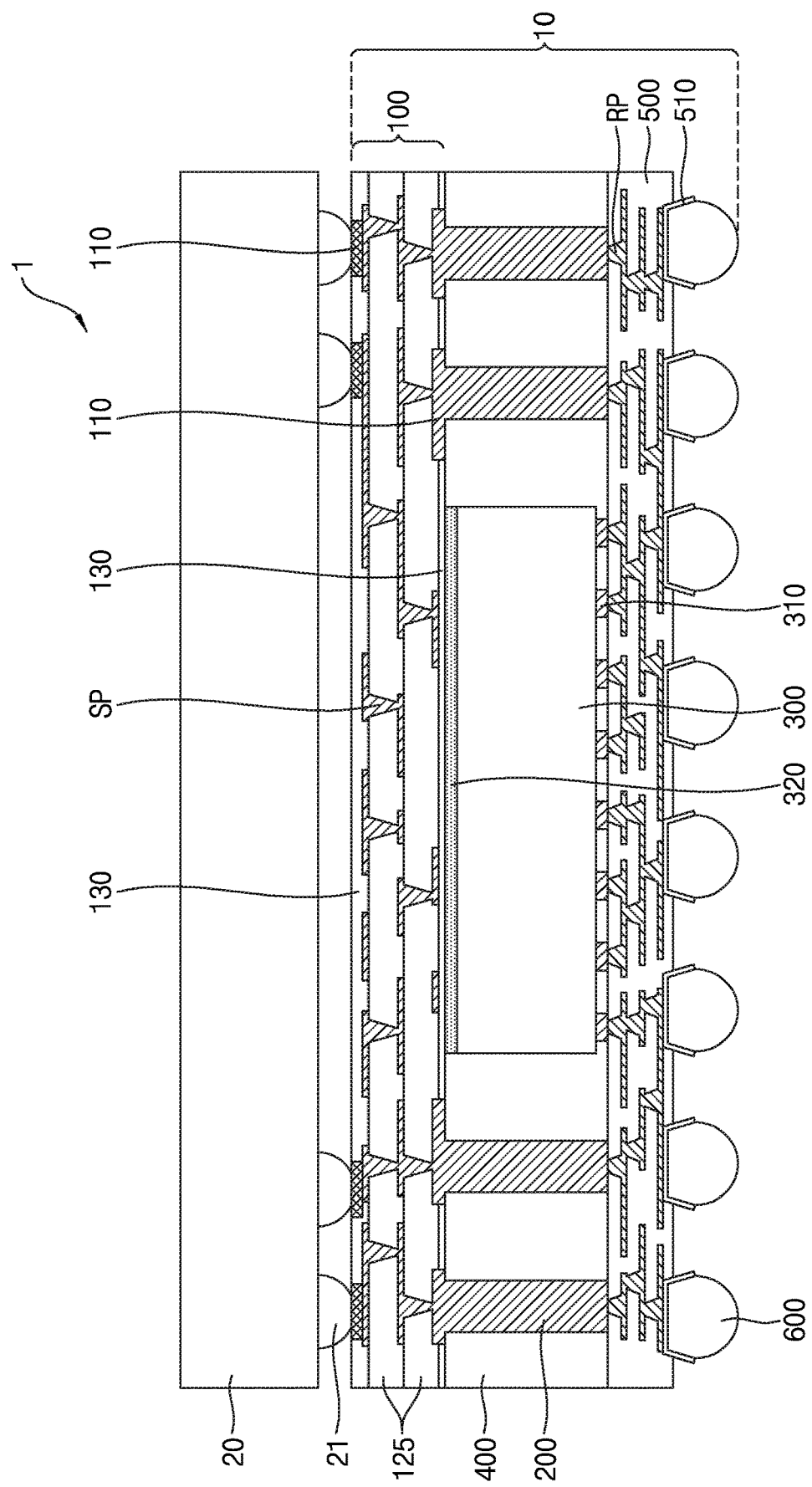
FIGS. 2B to 2E are views showing cross-sections of PoP type semiconductor packages according to various embodiments of the disclosure.

Referring to FIGS. 2A and 2B, the PoP type semiconductor package 1 according to some embodiments of the disclosure may include a lower package 10 and an upper package 20. The lower package 10 or the semiconductor package 10 may include a back-side wiring substrate 100, connectors 200, a semiconductor chip 300, an encapsulator 400, a front-side redistribution layer 500, and package bumps 600. The back-side wiring substrate 100 may include back-side pads 110, an insulating layer 125, a solder resist layer 130, and back-side via plugs SP. As compared to FIG. 1A, the back-side wiring substrate 100 may not include the core layer 120. Each of the back-side via plugs SP and redistribution layer patterns RP may have a shape having a cross-section gradually reduced while extending toward the semiconductor chip 300. That is, each back-side via plug SP may have a wide upper surface and a narrow lower surface such that side surfaces thereof have a negative (−) inclination. The insulating layer 125 may include a prepreg. The back-side via plugs SP of the back-side wiring substrate 100 may have a shape symmetrical to that of the redistribution patterns RP, which are included in a front-side redistribution layer 500. The back-side redistribution substrate 100 may be manufactured using a detached copper foil (DCF) process to be described later.

Figure 2C:
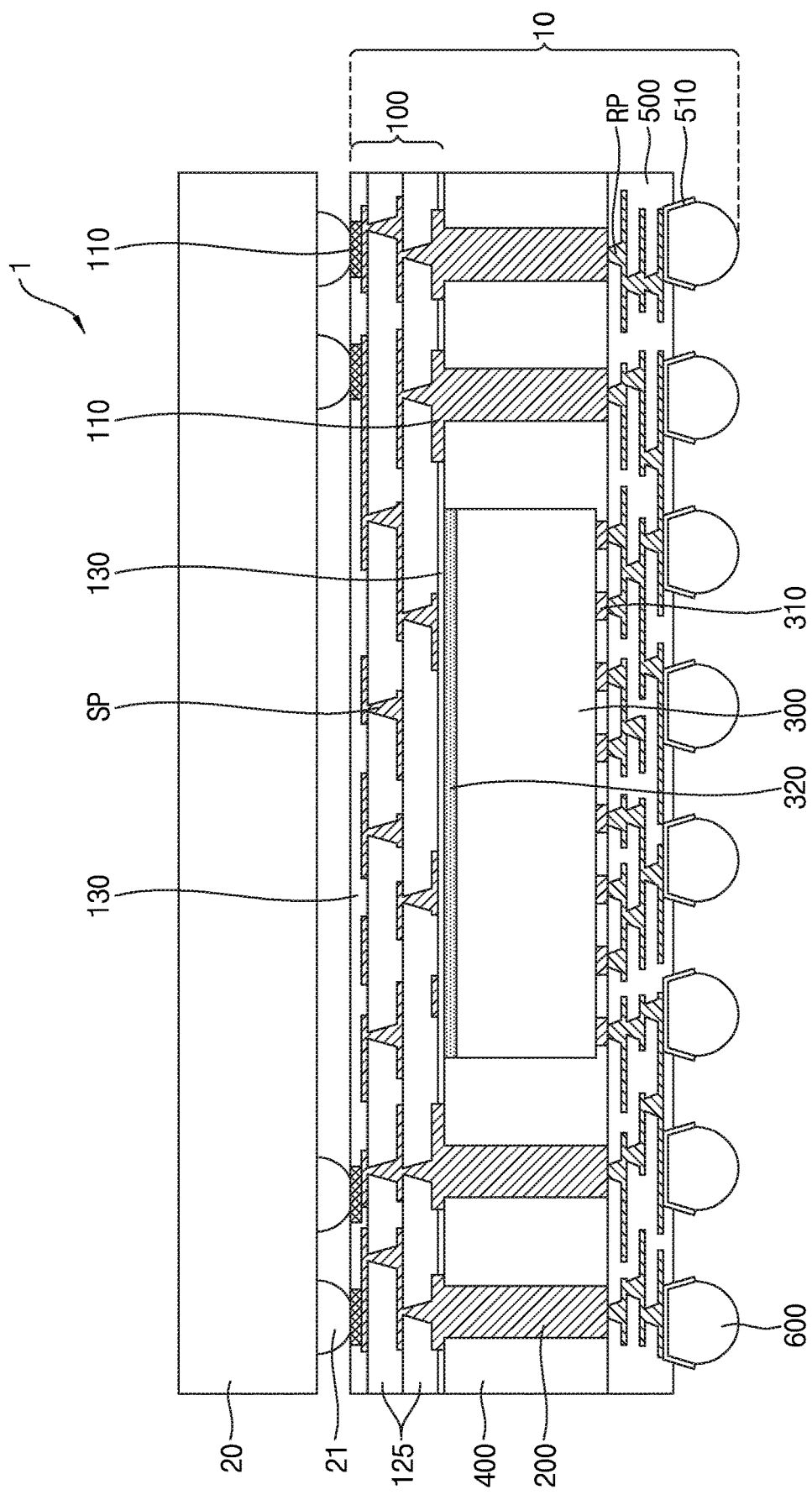

Referring to FIG. 2C, in some embodiments, each of the back-side via plugs SP and the redistribution layer patterns RP may have a shape having a cross-section gradually reduced while extending upwards. That is, each back-side via plug SP may have a narrow upper surface and a wide lower surface such that side surfaces thereof have a positive (+) inclination. The insulating layer 125 may include a prepreg. The back-side via plugs SP of the back-side wiring substrate 100 may have the same shape or a similar shape as the redistribution patterns RP of the front-side redistribution layer 500.

Figure 2D:
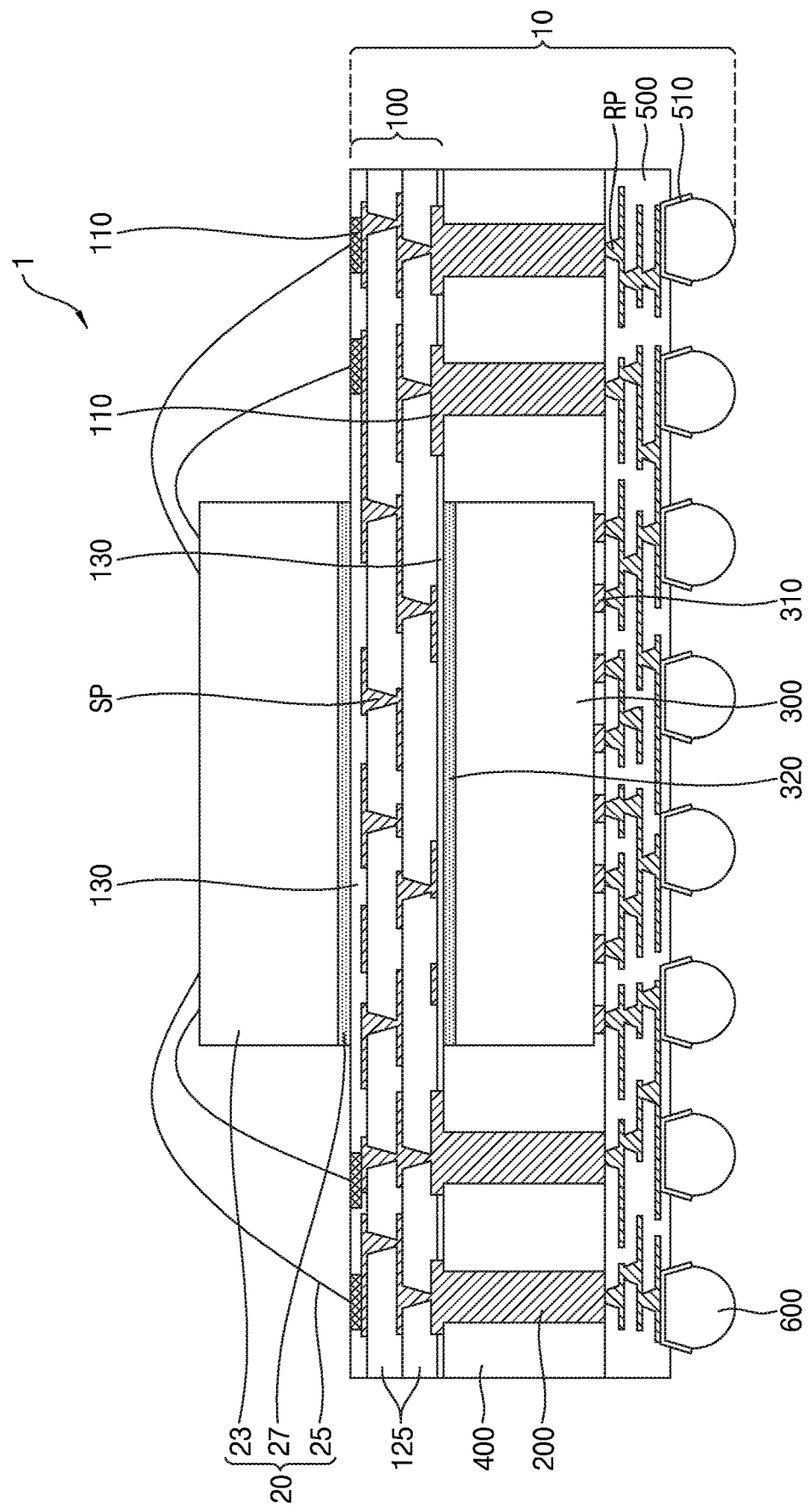

Referring to FIG. 2D, the PoP type semiconductor package 1 according to some embodiments of the disclosure may include a lower package 10, and an upper package 20 stacked on the lower package 10. The upper package 20 may include an upper semiconductor chip 23, upper bonding wires 25, and an upper chip adhesive film 27. The PoP type semiconductor package 1 of FIG. 2D may be better understood by referring to FIG. 1D.

Figure 2E:
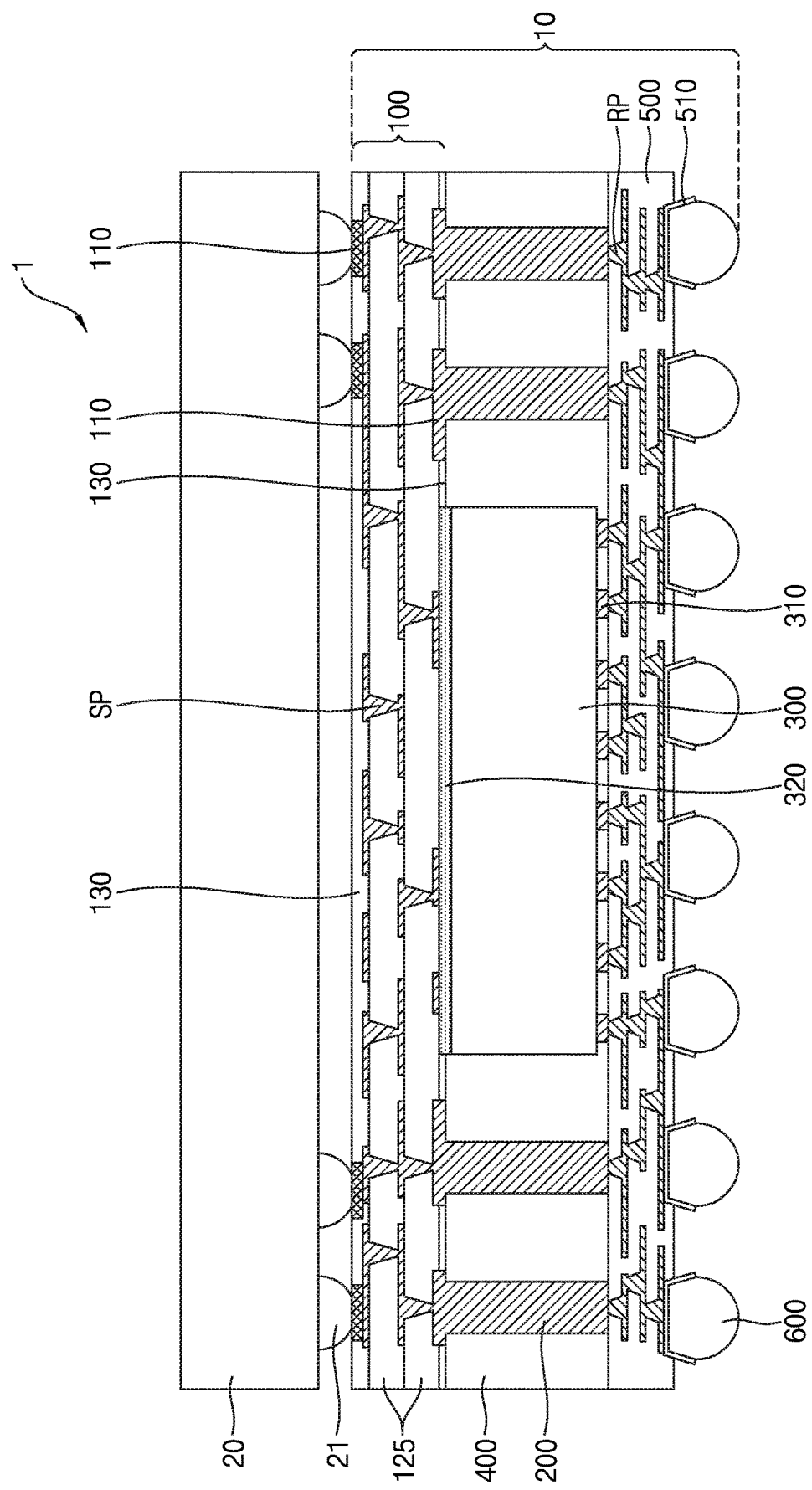

Referring to FIG. 2E, the PoP type semiconductor package 1 according to some embodiments of the disclosure may include a lower package 10, and an upper package 20 stacked on the lower package 10. A lower semiconductor chip 300 of the lower package 10 may be bonded to an upper surface of a lower back-side wiring layer 115*a* of a back-side wiring substrate 100. For example, a lower chip adhesive film 320 may contact the lower back-side wiring layer 115*a* of the back-side wiring substrate 100. The semiconductor package 10 of FIG. 2E may be better understood when referring to FIG. 1E.

Figure 3:
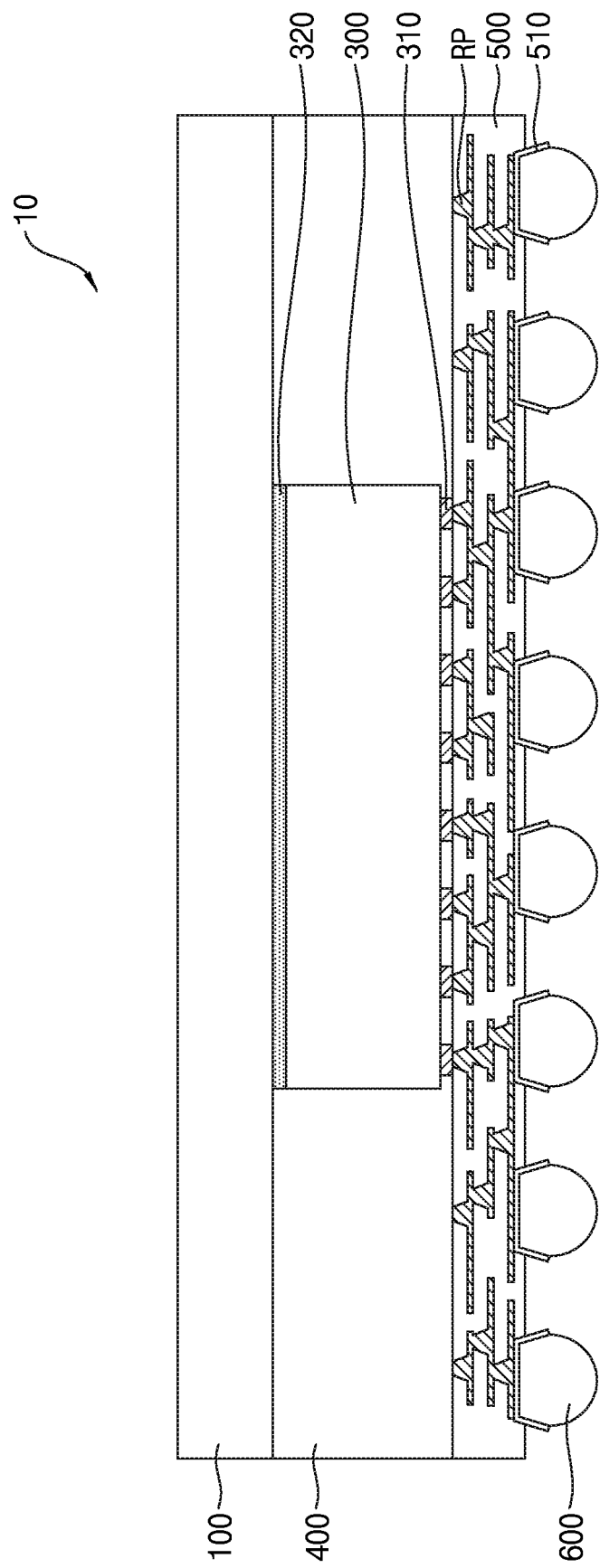
FIG. 3 is a view showing a cross-section of a semiconductor package according to various embodiments of the disclosure.

FIG. 3 is a view showing a cross-section of a semiconductor package 10 according to some embodiments of the disclosure. Referring to FIG. 3, the semiconductor package 10 may include a back-side wiring substrate 100 and a front-side redistribution layer 500 which are disposed in parallel, a semiconductor chip 300 disposed between the back-side wiring substrate 100 and the front-side redistribution layer 500, an adhesive film 320 disposed between the semiconductor chip 300 and the back-side wiring substrate 100, and an encapsulator 400 surrounding side surfaces of the semiconductor chip 300. That is, in some embodiments, connectors 200 of FIGS. 1A-1E and 2A-2E may be omitted. The back-side wiring substrate 100 may include a core layer.

In the semiconductor package 10 according to some embodiments of the disclosure, materials of the front-side redistribution layer 500 and the back-side wiring substrate 100 may differ from each other. The front-side redistribution layer 500 may include at least one of a polymer, nitride, etc. used in an RDL formation process. The back-side wiring substrate 100 may be a PCB substrate and, as such, may include epoxy or FR-4. Accordingly, the coefficient of thermal expansion (CTE) of the front-side redistribution layer 500 may be higher than that of the back-side wiring substrate 100. The CTE of the back-side wiring substrate 100 may be 1 ppm/° C. to 20 ppm/° C. The CTE of the front-side redistribution layer 500 may be 45 ppm/° C. to 80 ppm/° C.

In addition, the modulus of elasticity of the back-side wiring substrate 100 may be higher than that of the front-side redistribution layer 500. The modulus of elasticity of the back-side wiring substrate 100 may be 20 GPa to 40 GPa. The modulus of elasticity of the front-side redistribution layer 500 may be less than 10 GPa.

The back-side wiring substrate 100 may exhibit higher rigidity than the front-side redistribution layer 500 by virtue of a lower CTE thereof and a higher modulus of elasticity thereof than those of the front-side redistribution layer 500. Accordingly, the back-side wiring substrate 100 may be strong against warpage, as compared to the front-side redistribution layer 500. The semiconductor package 10 including the back-side wiring substrate 100 exhibits reduced warpage, as compared to the case including a back-side redistribution layer RDL, and, as such, may exhibit enhanced reliability when applied to the lower package 10 of the PoP type semiconductor package 1.

FIGS. 4A to 4H are views explaining a method for manufacturing the semiconductor package 10 or the PoP semiconductor package 1 according to some embodiments of the disclosure.

Referring to FIG. 4A, the method for manufacturing the semiconductor package 10 or the PoP semiconductor package 1 according to some embodiments of the disclosure may include preparing a back-side wiring substrate 100, and disposing connectors 200 on a first surface of the back-side wiring substrate 100. For example, the method may include attaching the back-side wiring substrate 100 to an upper surface of a carrier substrate CA, and forming the connectors 200 on the first surface of the back-side wiring substrate 100. The back-side wiring substrate 100 may include a PCB. The first surface of the back-side wiring substrate 100 may be flat. For example, there may be, on the first surface of the back-side wiring substrate 100, no cavity or recess capable of allowing disposition of a semiconductor chip therein. The back-side wiring substrate 100 may include a chip mounting area MA between the connectors 200. Each of the connectors 200 may include a conductor such as a copper bump, a solder paste, a copper ball, a copper block, or a wire. For example, each connector 200 may have a pillar or mesa shape. The vertical height of each connector 200 may be determined taking into consideration the thickness of the semiconductor package 10, accuracy of grinding equipment, flatness of the substrate 100, the thickness of a lower semiconductor chip 300, distribution of chip bumps 310, etc. Each connector 200 may have a height of about 30 μm to 110 μm before execution of a grinding process to be described later.

Figure 4B:
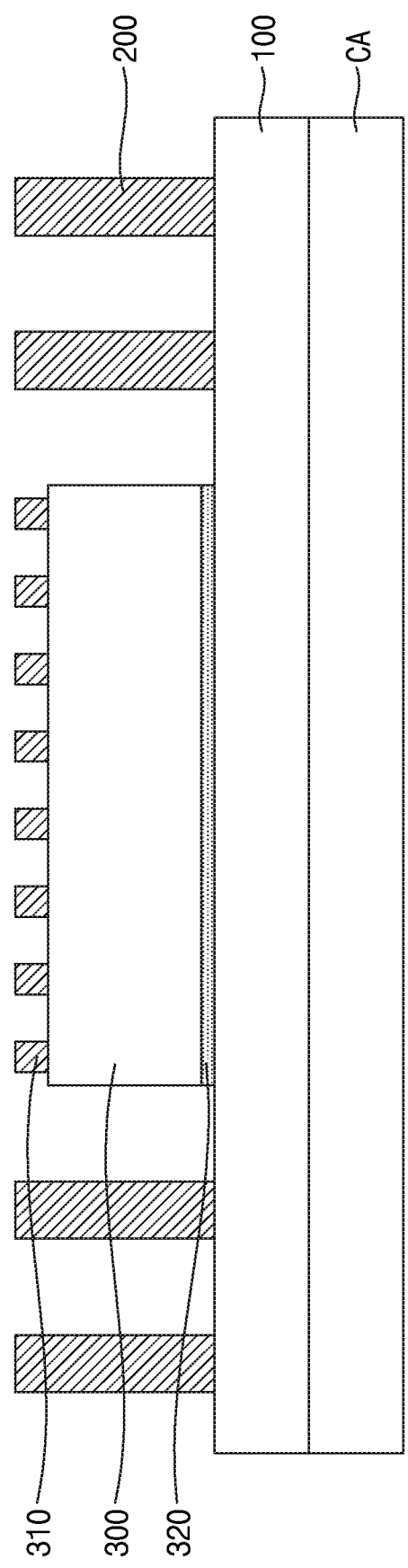

Referring to FIG. 4B, the method may include mounting the semiconductor chip 300 in the chip mounting area MA on the first surface of the back-side wiring substrate 100, and bonding the semiconductor chip 300. The semiconductor chip 300 may be bonded to the back-side wiring substrate 100 by a chip adhesive film 320 such as a die attach film (DAF). The thickness of the chip adhesive film 320 may be 5 µm or more. In some embodiments, the thickness of the chip adhesive film 320 may be 5 µm to 40 µm. Again referring to FIG. 1C or 2C, the semiconductor chip 300 may be bonded to an upper surface of a lower solder resist layer 130a of the back-side wiring substrate 100. For example, the chip adhesive film 320 may contact the lower solder resist layer 130a. In some embodiments, referring to FIG. 1E or 2E, the semiconductor chip 300 may be bonded to an upper surface of a lower back-side wiring layer 115a of the back-side wiring substrate 100. For example, the chip adhesive film 320 may contact the lower solder resist layer 130a and the lower back-side wiring layer 115a. In some embodiments, the method may further include partially removing the lower solder resist layer 130a of the back-side wiring substrate 100 using a light exposure process, a $CO_2$ laser, or the like, thereby exposing the lower back-side wiring layer 115a. When the exposed lower back-side wiring layer 115a and the lower semiconductor chip 300 are attached to each other while being spaced apart from each other by a reduced distance, heat dissipation characteristics of the lower semiconductor chip 300 may be enhanced. In some embodiments, the thermal conductivity of the chip adhesive film 300 may be 0.5 W/m·K to 10.0 W/m·K. The semiconductor chip may include chip bumps 310.

Figure 4C:
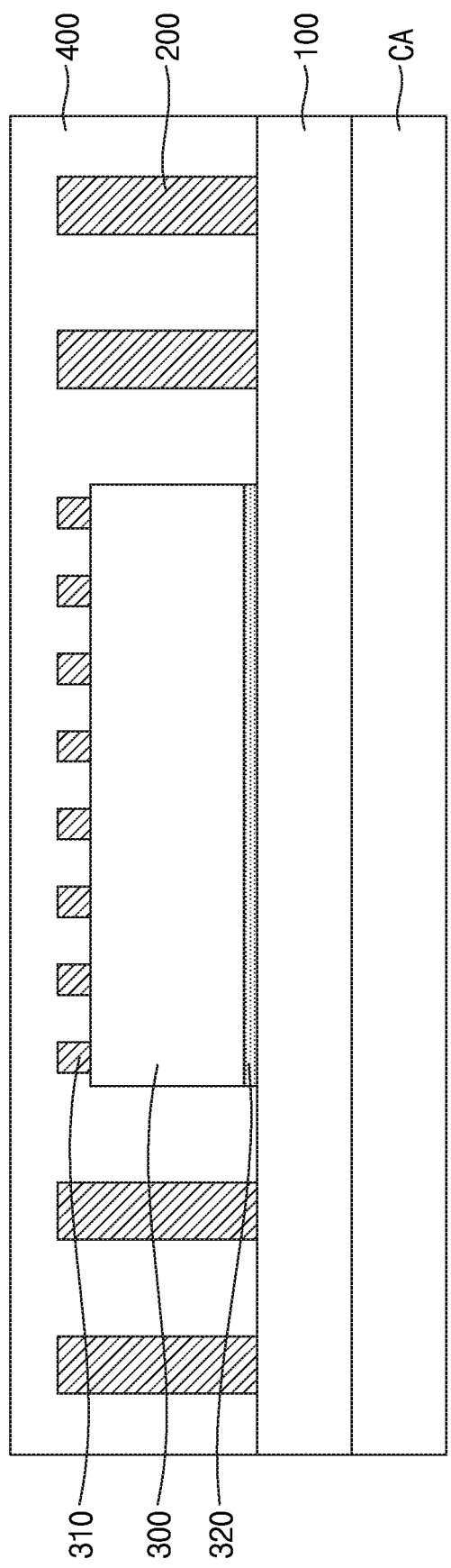

Referring to FIG. 4C, the method may include providing an encapsulator 400 on the first surface of the back-side wiring substrate 100, thereby covering or overlapping on side surfaces and/or upper surfaces of the connectors 200 and the semiconductor chip 300. The encapsulator 400 may be formed through a molding process or a lamination process for a molding sheet. The encapsulator 400 may be formed to have a sufficient thickness preventing the connectors 200 and the chip bumps 320 from being externally exposed. The encapsulator 400 may include thermosetting resin such as epoxy resin, thermoplastic resin such as polyimide, resin composed of the thermosetting or thermoplastic resin and a reinforcement included therein, or the like. In addition, the encapsulator 400 may include a molding material such as an epoxy molding compound (EMC) or a photosensitive material such as a photo-imageable encapsulant (PIE).

Figure 4D:
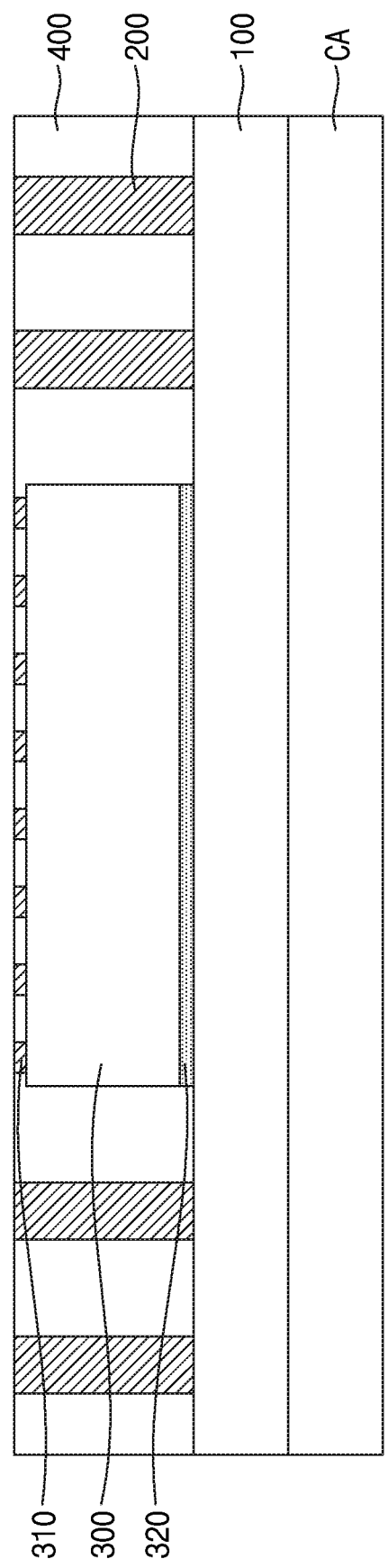

Referring to FIG. 4D, the method may include grinding an upper portion of the encapsulator 400, thereby exposing upper ends of the connectors 200 and the chip bumps 310. In some embodiments, the connectors 200 may have a height of about 20 µm to 95 µm after execution of a grinding process.

Figure 4E:
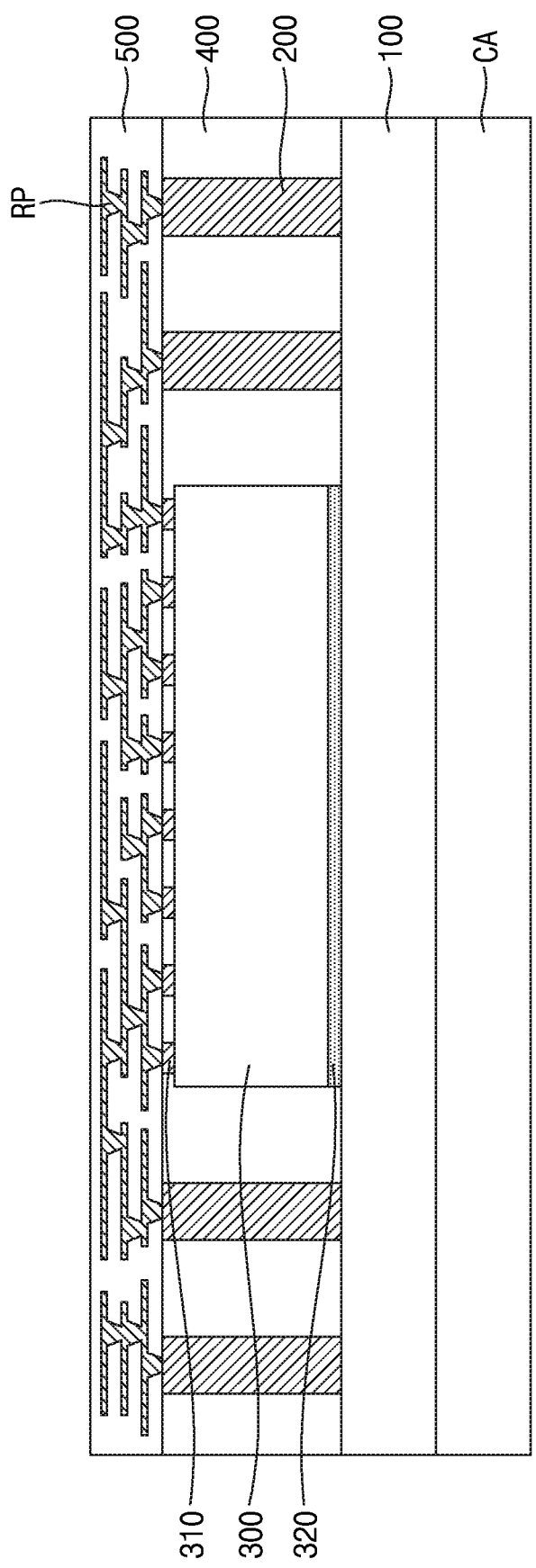

Referring to FIG. 4E, the method may include disposing a front-side redistribution layer 500 on the encapsulator 400, the exposed connectors 200, and the chip bumps 310. The connectors 200 and the chip bumps 310 may be connected to redistribution patterns RP of the front-side redistribution layer 500.

Figure 4F:
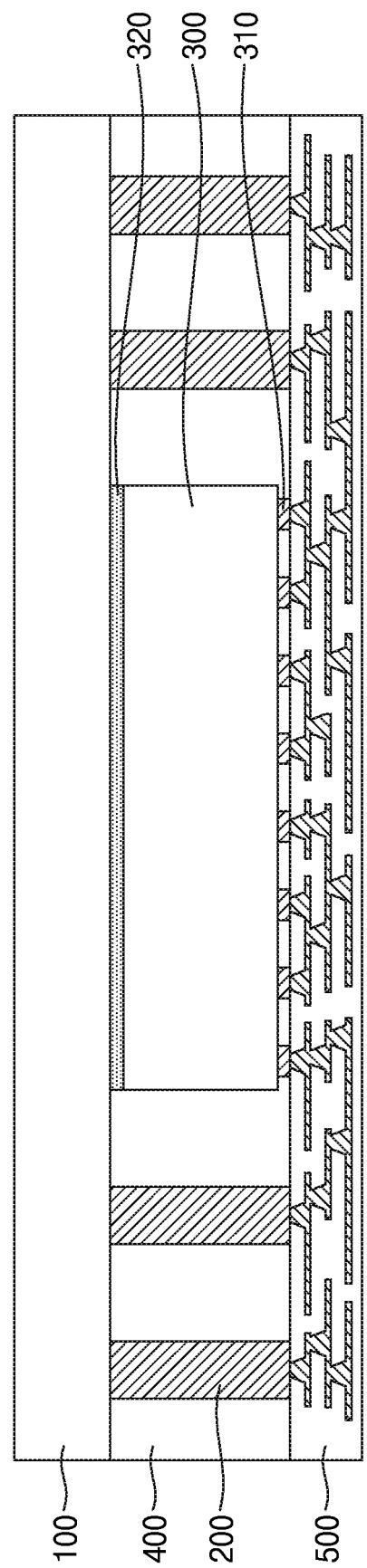

Referring to FIG. 4F, the method may include removing the carrier substrate CA, and inverting the resultant structure.

Figure 4G:
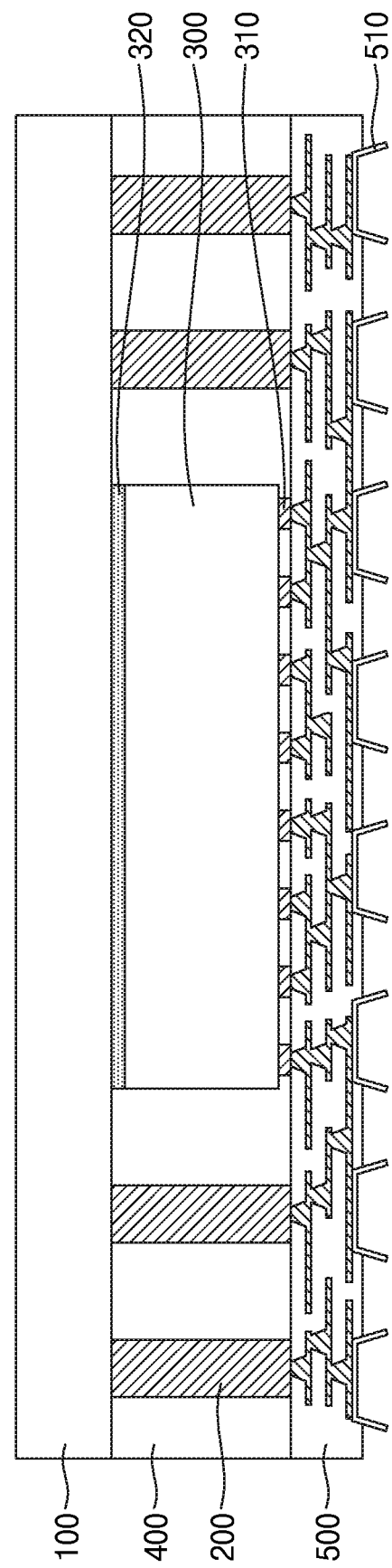

Referring to FIG. 4G, the method may include forming under-bump metals 510 at a lower portion of the front-side redistribution layer 500. After the redistribution patterns RP disposed at the lower portion of the front-side redistribution layer 500 are exposed, the under-bump metals 510 may be formed on the exposed redistribution patterns RP, respectively.

Figure 4H:
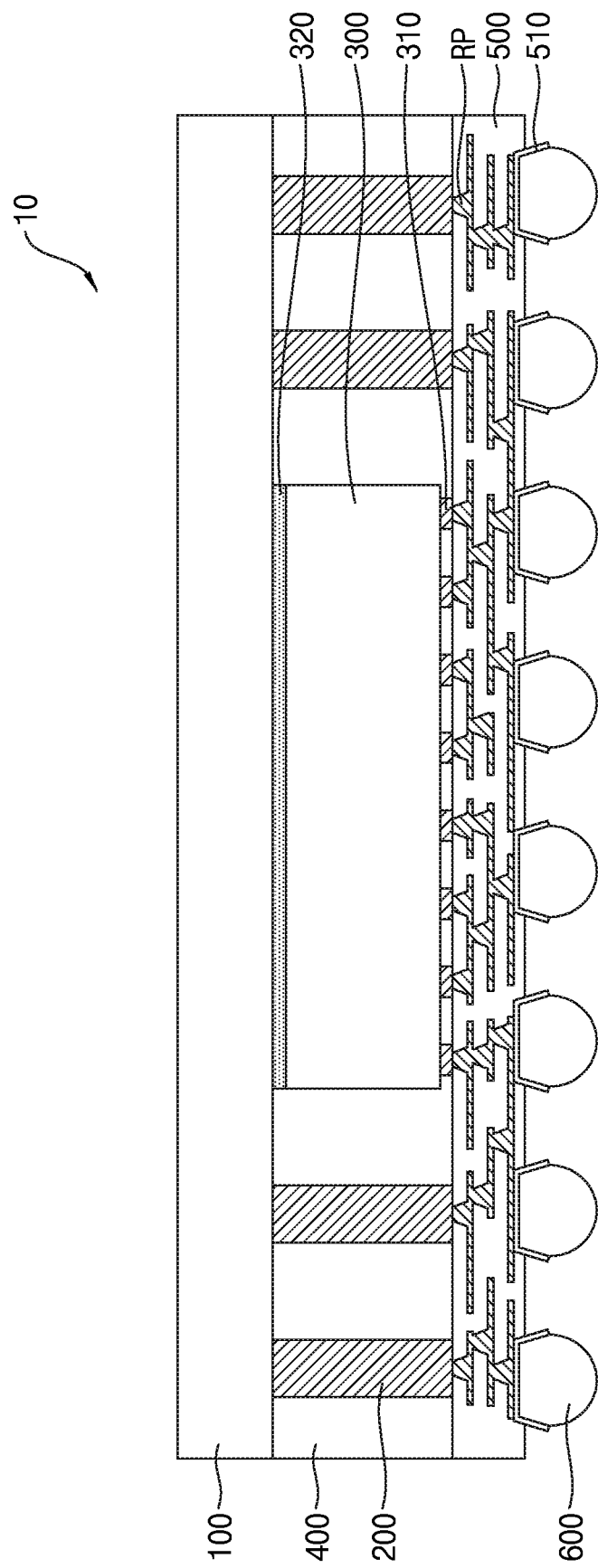

Referring to FIG. 4H, the method may include forming package bumps 600 at lower portions of the under-bump metals 510, respectively. Each package bump 600 may include a solder ball. The semiconductor package 10 may be formed through the processes described with reference to FIGS. 4A to 4G.

Again referring to FIGS. 1C and 2C, the method may further include stacking an upper package 20 on a second surface of the semiconductor package 10, thereby forming the PoP semiconductor package 1. In some embodiments, the method may include stacking the upper package 10 on the second surface of the semiconductor package 10 before formation of the package bumps 600.

Figure 5B:
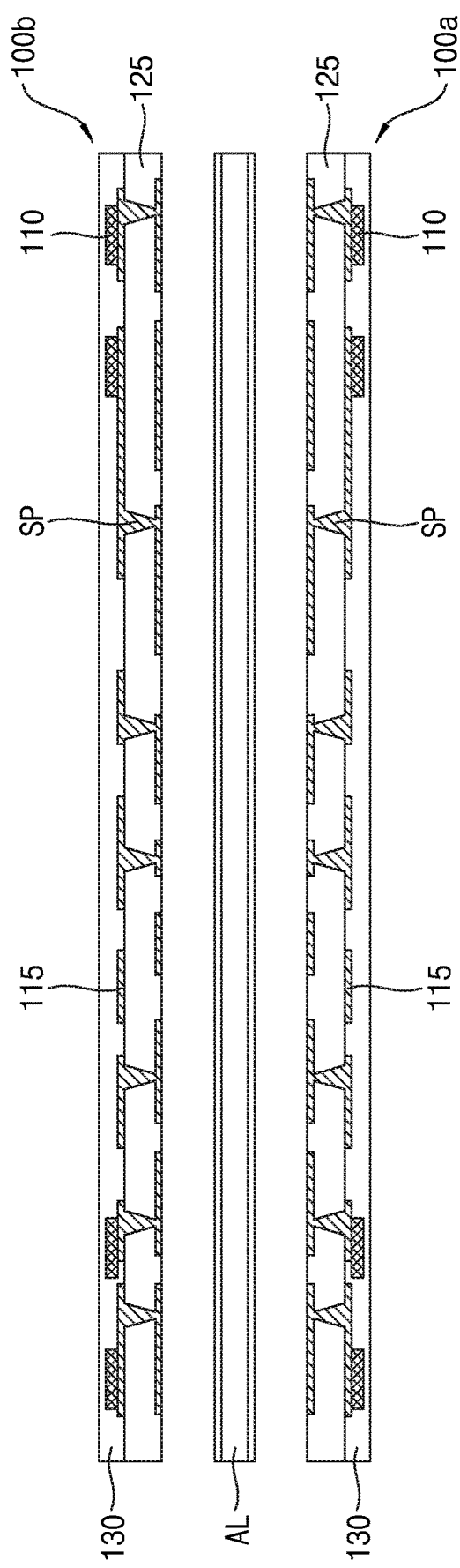

FIGS. 5A and 5B are views showing cross-sections of back-side wiring substrates 100a and 100b, according to some embodiments of the disclosure, that are manufactured through a detached copper foil (DCF) process.

Referring to FIG. 5A, the back-side wiring substrates 100a and 100b according to some embodiments of the disclosure may be symmetrically formed on upper and lower surfaces of a central adhesive layer AL, respectively. The back-side wiring substrates 100a and 100b may include respective back-side wiring layers 115, respective insulating layers 125, respective back-side via plugs SP, respective back-side pads 110 and respective solder resist layers 130 which are formed on the upper and lower surfaces of the adhesive layer AL. The solder resist layers 130 of the back-side wiring substrates 100a and 100b may be partially removed and, as such, the back-side pads 110 may be exposed. Referring to FIG. 5B, the adhesive layer AL may be removed from the state of FIG. 5A and, as such, the back-side wiring substrates 100a and 100b may be separated from each other. Referring to FIGS. 5A and 5B, the back-side wiring substrates 100a and 100b which are not separated from each other may be manufactured to have vertically symmetrical shapes, and the separated back-side wiring substrates 100a and 100b may have the same shape or a similar shape.

Figure 6B:
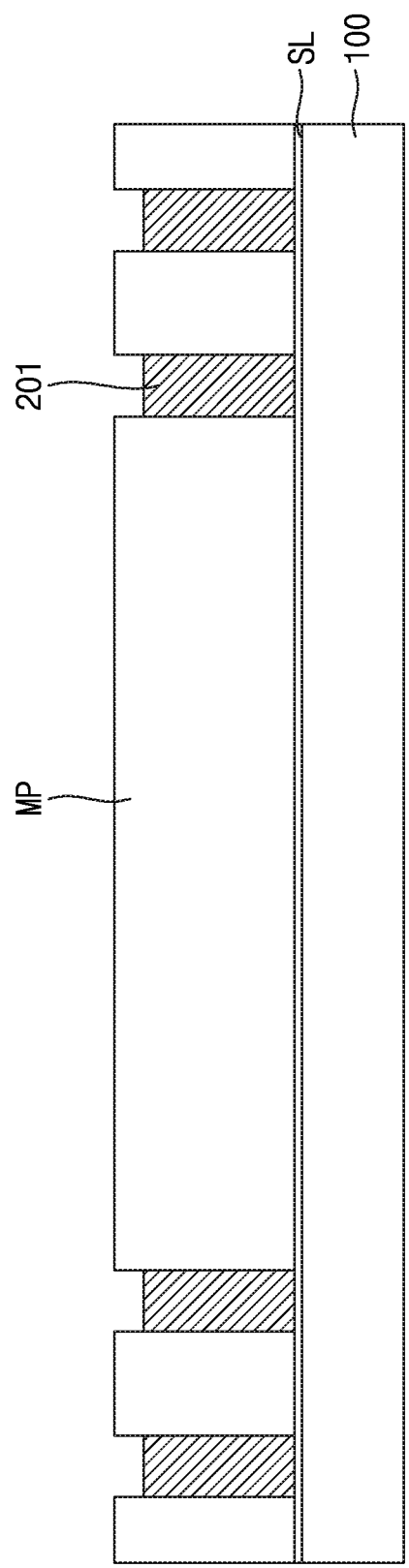
Figure 6C:
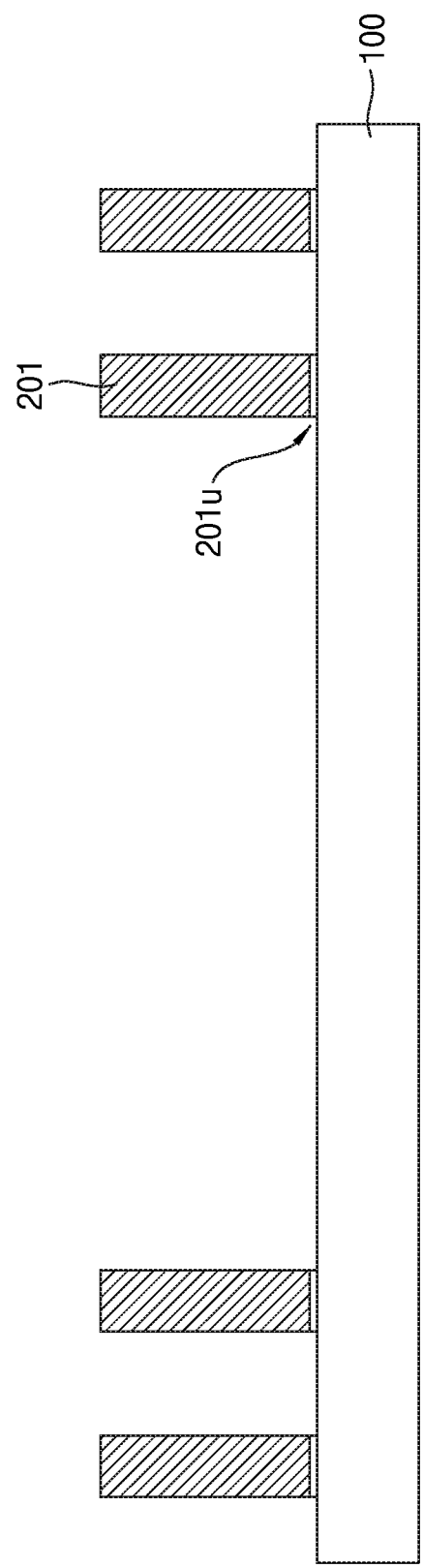

FIGS. 6A to 6C are views explaining a method for forming a bump type connector 201 according to some embodiments of the disclosure.

Referring to FIG. 6A, the method for forming the bump type connector 201 according to some embodiments of the disclosure may include forming a seed layer SL on the back-side wiring substrate 100, and forming a plating mask pattern MP having openings O on the seed layer SL. Formation of the seed layer SL may include thinly forming a metal layer made of metal such as copper (Cu), titanium (Ti) or tungsten (W). Formation of the plating mask pattern MP may include forming a photoresist pattern on the seed layer SL. The openings O may expose positions at which bump type connectors 201 will be formed, respectively.

Referring to FIG. 6B, the method may include forming bump type connectors 201 within the openings O, respectively, through execution of a plating process. The bump type connectors 201 may include copper. The diameter or horizontal width of each bump type connector 201 may be 10 µm to 300 µm.

Referring to FIG. 6C, the method may include removing the plating mask pattern MP, and removing the exposed seed layer SL. Accordingly, the seed layer 201u may be formed beneath the bump type connectors 201.

Figure 7A:
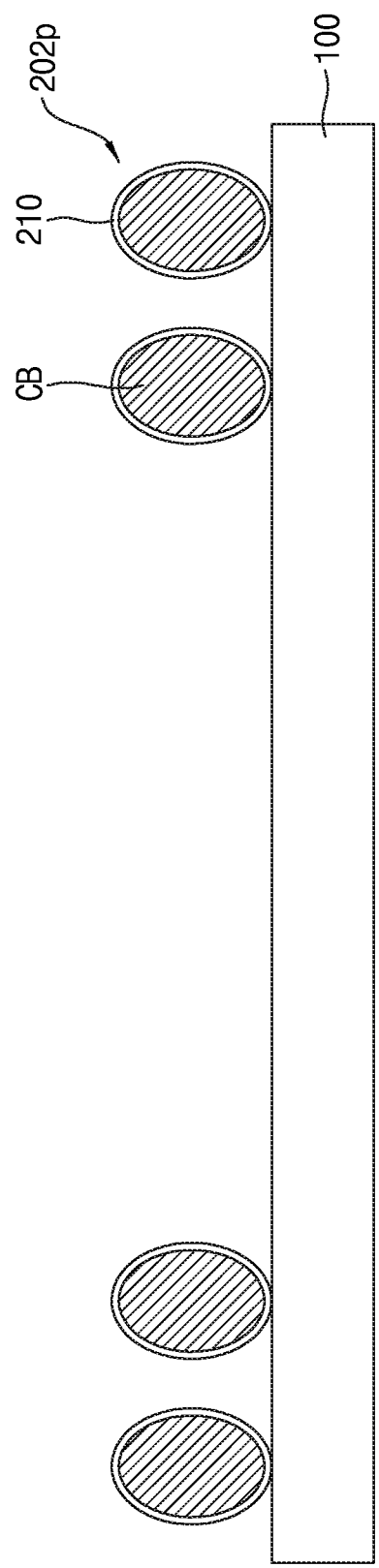
FIGS. 7A and 7B are views explaining a method for forming a ball type connector according to various embodiments of the disclosure.
Figure 7B:
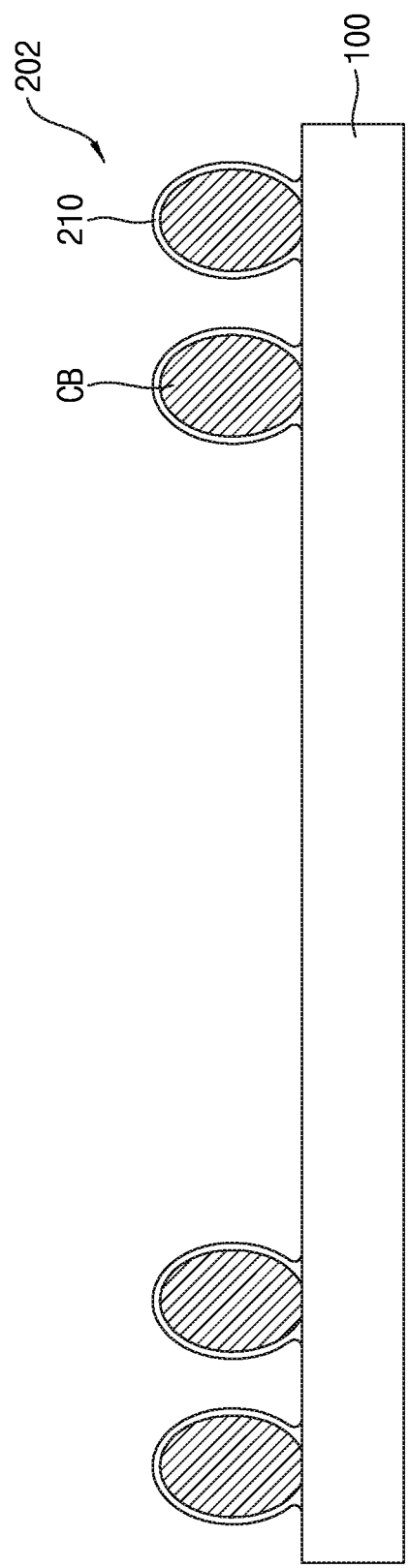

FIGS. 7A and 7B are views explaining a method for forming a ball type connector 202 according to some embodiments of the disclosure.

Referring to FIG. 7A, the method for forming the ball type connector 202 according to some embodiments of the disclosure may include disposing, on the back-side wiring substrate 100, preliminary connectors 202p each including a metal ball such as a copper ball CB or an aluminum ball AB, and a solder 210 surrounding the metal ball.

Referring to FIG. 7B, the method may include attaching metal balls 202 to the back-side wiring substrate 100 through execution of a reflow process, thereby forming ball type connectors 202.

Figure 8A:
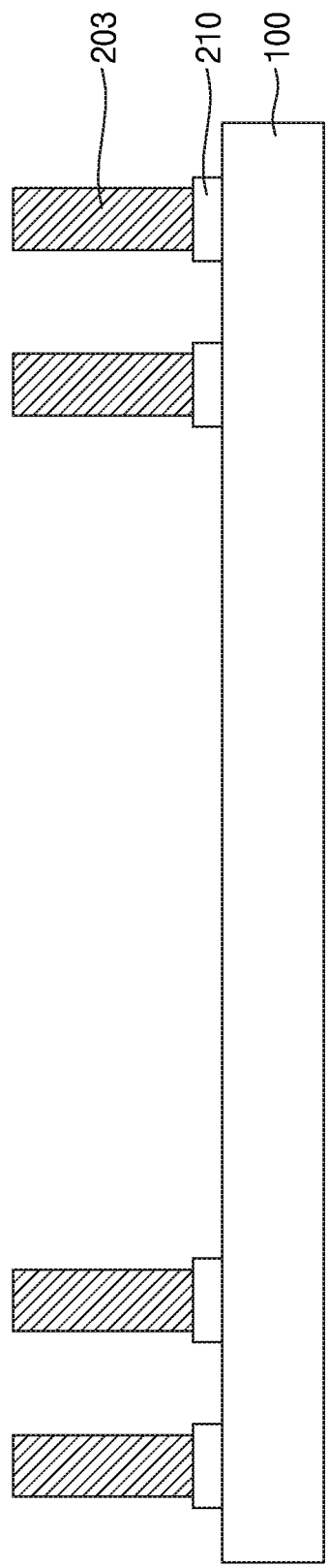
FIGS. 8A and 8B are views explaining a method for forming a block type connector according to various embodiments of the disclosure.
Figure 8B:
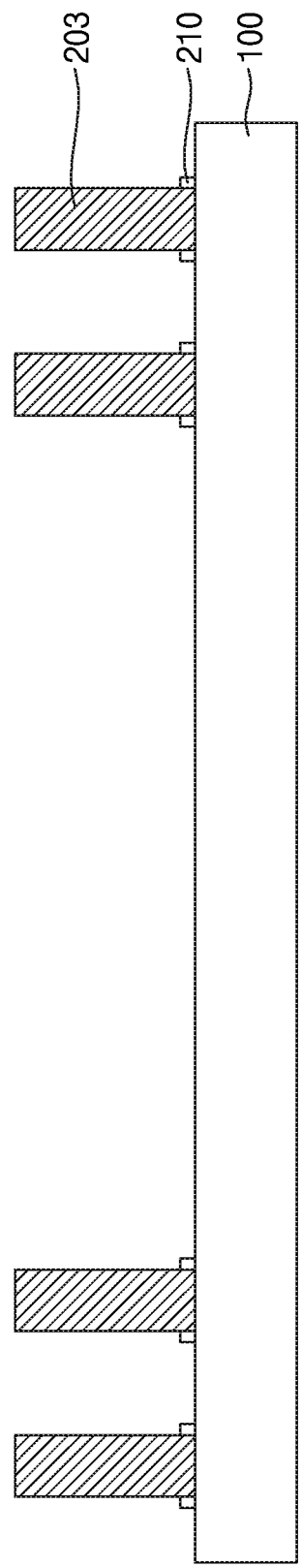

FIGS. 8A and 8B are views explaining a method for forming a block type connector 203 according to some embodiments of the disclosure.

Referring to FIG. 8A, the method may include disposing solders 210 on the back-side wiring substrate 100, and forming, on respective solders 210, cube-shaped metal blocks 203 made of metal such as copper or aluminum.

Referring to FIG. 8B, the method may include attaching the metal blocks 203 to an upper surface of the back-side wiring substrate 100 through execution of a reflow process.

As apparent from the above description, in the PoP semiconductor package 1 according to some embodiments of the disclosure, the back-side wiring substrate 100 of the lower semiconductor package 10 includes a PCB substrate. As such, this arrangement may eliminate an interposer between the upper package 20 and the lower package 10 or to eliminate a package substrate of the upper package. As a previously manufactured PCB substrate is used on a back side of the PoP semiconductor package 1, it may be possible to easily form a back-side redistribution layer without execution of redistribution layer fine patterning lithography. Furthermore, it may be possible to easily increase the number of layers in the back-side redistribution layer in accordance with the number of layers in a substrate to be used. In addition, in accordance with a previously manufactured substrate, it may be possible to attach a known good die (KGD) only to a known good unit (KGU) distinguished through an appearance test and an electrical test in a PCB process and, as such, risk of decrease in yield may be reduced. In addition, since the connectors 200 are formed on the back-side wiring substrate 200, and since the semiconductor chip 300 is directly attached to an upper surface of the back-side wiring substrate 100, it may be possible to eliminate a process for forming a cavity at the back-side wiring substrate 100 of the PCB substrate. Accordingly, process simplification may be achieved. In some embodiments of the disclosure in which no cavity is formed at the back-side wiring substrate 100, it may be possible to eliminate a post chemical treatment process for polishing a rough surface of a cavity, such as de-burring or desmear, which are needed in cases in which the cavity is formed. Furthermore, it may be possible to prevent a decrease in yield or an increase in failure such as delamination caused by breakage of voids formed during encapsulation occurring in a subsequent RDL formation process due to a rough inner wall surface.

While the embodiments of the disclosure have been described with reference to the accompanying drawings, it should be understood by those skilled in the art that various modifications may be made without departing from the scope of the disclosure and without changing essential features thereof. Therefore, the above-described embodiments are therefore to be construed in all aspects as illustrative and not restrictive.

What is claimed is:

1. A method for manufacturing a semiconductor package, comprising:
preparing a back-side wiring substrate, wherein the back-side wiring substrate is a printed circuit board (PCB) comprising a core layer, a back-side via plug, a back-side wiring layer, and a back-side pad;
disposing connectors on the back-side pad and on a first surface of the back-side wiring substrate;
disposing a lower semiconductor chip between the connectors on the first surface of the back-side wiring substrate, wherein the lower semiconductor chip comprises a chip bump at an upper surface thereof;
providing an encapsulator on the first surface of the back-side wiring substrate, wherein the encapsulator is on side surfaces of the connectors and the lower semiconductor chip; and
forming a front-side redistribution layer on the encapsulator, on portions of the connectors that are exposed by the encapsulator, and on the chip bump,
wherein a coefficient of thermal expansion of the front-side redistribution layer is greater than a coefficient of thermal expansion of the back-side wiring substrate, and
wherein a modulus of elasticity of the back-side wiring substrate is greater than a modulus of elasticity of the front-side redistribution layer.

2. The method according to claim 1, wherein the preparing the back-side wiring substrate comprises attaching the back-side wiring substrate to a surface of a carrier substrate.

3. The method according to claim 1, wherein the disposing the connectors comprises forming the connectors on respective back-side pads of the back-side wiring substrate.

4. The method according to claim 1, wherein the back-side via plug comprises an upper back-side via plug and a lower back-side via plug that extend through upper and lower portions of the core layer, respectively.

5. The method according to claim 4, wherein the back-side wiring layer comprises an upper back-side wiring layer electrically connected to the upper back-side via plug, and a lower back-side wiring layer electrically connected to the lower back-side via plug.

6. The method according to claim 5, wherein the back-side pad comprises an upper back-side pad on the upper back-side wiring layer, and a lower back-side pad on the lower back-side wiring layer.

7. The method according to claim 6, wherein the lower back-side pad has a truncated cone shape with a wider lower portion than an upper portion of the lower back-side pad.

8. The method according to claim 1, wherein the back-side via plug has an hourglass shape.

9. The method according to claim 4, wherein the upper back-side via plug has a wider upper surface than a lower surface of the upper back-side via plug.

10. The method according to claim 4, wherein the lower back-side via plug has a narrower upper surface than a lower surface of the lower back-side via plug.

11. The method according to claim 1, wherein the forming the connectors comprises forming a bump on the back-side pad of the back-side wiring substrate.

12. The method according to claim 11, wherein the connectors have a pillar, mesa, or cube shape.

13. The method according to claim 1,
wherein the front-side redistribution layer comprises an insulating layer, a front-side wiring layer, and a front-side via plug, and
wherein the front-side via plug comprises a narrower upper surface than a lower surface of the front-side via plug.

14. The method according to claim 13, wherein the insulating layer comprises a silicon-based insulating material.

15. The method according to claim 1, further comprising:
a lower package bump on a lower surface of the front-side redistribution layer.

16. The method according to claim 1, wherein the disposing the lower semiconductor chip on the first surface of the back-side wiring substrate comprises bonding a lower surface of the lower semiconductor chip on the first surface of the back-side wiring substrate using an adhesive film.

17. A method for manufacturing a semiconductor package, comprising:
preparing a printed circuit board (PCB) having flat first and second surfaces;
disposing connectors directly on the first surface of the PCB;
bonding a lower semiconductor chip having a chip bump between the connectors on the first surface of the PCB using an adhesive film;
providing an encapsulator on the first surface of the PCB, wherein the encapsulator is on side and upper surfaces of the connectors and the lower semiconductor chip;
grinding an upper portion of the encapsulator to expose the connectors and the chip bump of the lower semiconductor chip; and
forming a front-side redistribution layer on the encapsulator, the connectors that were exposed, and the chip bump,
wherein a coefficient of thermal expansion of the front-side redistribution layer is higher than a coefficient of thermal expansion of the PCB, and
wherein a modulus of elasticity of the PCB is higher than a modulus of elasticity of the front-side redistribution layer.

18. A method for manufacturing a semiconductor package, comprising:
preparing a printed circuit board (PCB) comprising a core layer, a back-side via plug, a back-side wiring layer, and a back-side pad;
disposing connectors on the back-side pad on a first surface of the PCB;
disposing a lower semiconductor chip between the connectors on the first surface of the PCB, wherein the lower semiconductor chip comprises a chip bump at an upper surface thereof;
providing an encapsulator on the first surface of the PCB, wherein the encapsulator is on side and upper surfaces of the connectors and the lower semiconductor chip;
grinding an upper portion of the encapsulator to expose the connectors and the chip bump of the lower semiconductor chip; and
forming a front-side redistribution layer on the encapsulator, the connectors that were exposed, and the chip bump,
wherein a coefficient of thermal expansion of the front-side redistribution layer is higher than a coefficient of thermal expansion of the PCB, and
wherein a modulus of elasticity of the PCB is higher than a modulus of elasticity of the front-side redistribution layer.

* * * * *